United States Patent
Luo et al.

(10) Patent No.: US 11,973,513 B2
(45) Date of Patent: Apr. 30, 2024

(54) DECODERS AND SYSTEMS FOR DECODING ENCODED DATA USING NEURAL NETWORKS

(71) Applicant: MICRON TECHNOLOGY, INC., Boise, ID (US)

(72) Inventors: Fa-Long Luo, San Jose, CA (US); Jaime Cummins, Bainbridge Island, WA (US)

(73) Assignee: Micron Technology, Inc., Boise, ID (US)

( * ) Notice: Subject to any disclaimer, the term of this patent is extended or adjusted under 35 U.S.C. 154(b) by 308 days.

(21) Appl. No.: 17/302,226

(22) Filed: Apr. 27, 2021

(65) Prior Publication Data

US 2022/0368349 A1    Nov. 17, 2022

(51) Int. Cl.
*G06F 11/00*      (2006.01)
*G06N 3/049*      (2023.01)
(Continued)

(52) U.S. Cl.
CPC ............ H03M 13/01 (2013.01); G06N 3/049 (2013.01); G06N 3/08 (2013.01);
(Continued)

(58) Field of Classification Search
CPC ............ G06F 11/1044; G06F 11/0751; G06F 11/1476; G06F 11/1068; G06F 11/1012; H03M 13/01; H03M 13/616
See application file for complete search history.

(56) References Cited

U.S. PATENT DOCUMENTS 7,321,882 B2    1/2008    Jaeger
9,988,090 B2    6/2018    Nishikawa
(Continued)

FOREIGN PATENT DOCUMENTS

KR    20180054554 A    5/2018
KR    20180084988 A    7/2018
(Continued)

OTHER PUBLICATIONS

International Search Report and Written Opinion for International Application No. PCT/US2022/026219 dated Oct. 17, 2022; pp. all.
(Continued)

*Primary Examiner* — Charles Ehne
(74) *Attorney, Agent, or Firm* — Dorsey & Whitney LLP

(57) ABSTRACT

Examples described herein utilize multi-layer neural networks, such as multi-layer recurrent neural networks to estimate message probability compute data based on encoded data (e.g., data encoded using one or more encoding techniques). The neural networks and/or recurrent neural networks may have nonlinear mapping and distributed processing capabilities which may be advantageous in many systems employing a neural network or recurrent neural network to estimate message probability compute data for a message probability compute (MPC) decoder. In this manner, neural networks or recurrent neural networks described herein may be used to implement aspects of error correction coding (ECC) decoders, e.g., an MPC decoder that iteratively decodes encoded data.

19 Claims, 12 Drawing Sheets

(51) Int. Cl.
- *G06N 3/08* (2023.01)
- *H03M 13/01* (2006.01)
- *H03M 13/11* (2006.01)
- *H03M 13/13* (2006.01)

(52) U.S. Cl.
CPC .... *H03M 13/1105* (2013.01); *H03M 13/1148* (2013.01); *H03M 13/13* (2013.01)

(56) References Cited

U.S. PATENT DOCUMENTS

| | | | |
|---|---|---|---|
| 10,176,802 | B1 | 1/2019 | Ladhak et al. |
| 10,400,928 | B2 | 9/2019 | Baldwin et al. |
| 10,491,243 | B2 * | 11/2019 | Kumar ............... G06N 3/045 |
| 10,552,738 | B2 | 2/2020 | Holt et al. |
| 10,698,657 | B2 | 6/2020 | Kang et al. |
| 10,812,449 | B1 | 10/2020 | Cholleton |
| 10,924,152 | B1 | 2/2021 | Luo |
| 11,088,712 | B2 | 8/2021 | Zamir et al. |
| 11,196,992 | B2 | 12/2021 | Huang et al. |
| 11,416,735 | B2 | 8/2022 | Luo et al. |
| 11,424,764 | B2 | 8/2022 | Luo |
| 11,563,449 | B2 | 1/2023 | Luo et al. |
| 11,599,773 | B2 | 3/2023 | Luo et al. |
| 11,755,408 | B2 | 9/2023 | Luo et al. |
| 2004/0015459 | A1 | 1/2004 | Jaeger |
| 2005/0228845 | A1 | 10/2005 | Pius et al. |
| 2009/0106626 | A1 * | 4/2009 | Hou ............... H03M 13/1197 714/E11.017 |
| 2011/0029756 | A1 | 2/2011 | Biscondi et al. |
| 2017/0177993 | A1 | 6/2017 | Draelos et al. |
| 2017/0310508 | A1 | 10/2017 | Moorti et al. |
| 2017/0370508 | A1 | 12/2017 | Baldwin et al. |
| 2018/0022388 | A1 | 1/2018 | Nishikawa |
| 2018/0046897 | A1 | 2/2018 | Kang et al. |
| 2018/0174050 | A1 | 6/2018 | Holt et al. |
| 2018/0249158 | A1 | 8/2018 | Huang et al. |
| 2018/0307494 | A1 | 10/2018 | Ould-Ahmed-Vall et al. |
| 2018/0322388 | A1 | 11/2018 | O'Shea |
| 2018/0336469 | A1 | 11/2018 | O'Connor et al. |
| 2018/0343017 | A1 | 11/2018 | Kumar et al. |
| 2018/0357530 | A1 * | 12/2018 | Beery ............... H04L 1/0045 |
| 2019/0196952 | A1 | 6/2019 | Manchiraju et al. |
| 2019/0197549 | A1 | 6/2019 | Sharma |
| 2020/0012953 | A1 | 1/2020 | Sun et al. |
| 2020/0014408 | A1 | 1/2020 | Kim |
| 2020/0065653 | A1 | 2/2020 | Meier et al. |
| 2020/0160838 | A1 | 5/2020 | Lee |
| 2020/0210816 | A1 | 7/2020 | Luo et al. |
| 2020/0234103 | A1 | 7/2020 | Luo et al. |
| 2020/0356620 | A1 | 11/2020 | Yen et al. |
| 2020/0402591 | A1 | 12/2020 | Xiong et al. |
| 2021/0004208 | A1 | 1/2021 | Lai et al. |
| 2021/0143840 | A1 | 5/2021 | Luo |
| 2021/0273707 | A1 | 9/2021 | Yoo et al. |
| 2021/0287074 | A1 | 9/2021 | Coenen |
| 2021/0304009 | A1 | 9/2021 | Bazarsky et al. |
| 2021/0319286 | A1 | 10/2021 | Gunduz |
| 2021/0336779 | A1 | 10/2021 | Jho et al. |
| 2021/0351863 | A1 | 11/2021 | Gunduz |
| 2022/0019900 | A1 | 1/2022 | Wong et al. |
| 2022/0368349 | A1 | 11/2022 | Luo et al. |
| 2022/0368356 | A1 | 11/2022 | Luo et al. |
| 2023/0115877 | A1 | 4/2023 | Luo et al. |
| 2023/0208449 | A1 | 6/2023 | Luo et al. |

FOREIGN PATENT DOCUMENTS

| | | |
|---|---|---|
| KR | 20200062322 A | 6/2020 |
| KR | 20200124504 A | 11/2020 |
| WO | 2020131868 A1 | 6/2020 |
| WO | 2020139976 A1 | 7/2020 |
| WO | 2021096641 A1 | 5/2021 |
| WO | 2022232065 A1 | 11/2022 |
| WO | 2022232066 A1 | 11/2022 |
| WO | WO 2023/059517 | 4/2023 |

OTHER PUBLICATIONS

PCT application No. PCT/US2022/045432 filed on Sep. 30, 2022 titled, "Systems for Estimating Bit Error Rate (BER) of Encoded Data Using Neural Networks"; pp. all.

PCT Application No. PCT/US22/26217 titled "Systems for Error Reduction of Encoded Data Using Neural Networks" filed Apr. 25, 2022; pp. all.

PCT Application No. PCT/US22/26219 titled "Decoders and Systems for Decoding Encoded Data Using Neural Networks" filed Apr. 25, 2022, ; pp. all.

U.S. Appl. No. 17/821,391, titled, "Recurrent Neural Networks and Systems for Decoding Encoded Data," filed Aug. 22, 2022, pp. all pages of application as filed.

Cao, Congzhe , et al., "Deep Learning-Based Decoding of Constrained Sequence Codes", Retrieved from URL: https://arxiv.org/pdf/1906.06172, Jun. 2019, 13 pages.

Huang, Kunping , et al., "Functional Error Correction for Robust Neural Networks", Retrieved from URL: https://arxiv.org/pdf/2001.03814, Jan. 2020, 24 pages.

U.S. Appl. No. 17/496,703 titled "Systems for Estimating Bit Error Rate (BER) of Encoded Data Using Neural Networks" filed Oct. 7, 2021.

Navneet Agrawal "Machine Intelligence in Decoding of Forward Error Correction Codes"; Degree Project in Information and Communication Technology; KTH Royal Institute of Technology, School of Electrical Engineering; Sweeden Oct. 2017; pp. all.

U.S. Appl. No. 18/158,332, filed Jan. 23, 2023, titled, "Systems for Error Reduction of Encoded Data Using Neural Networks,"; pp. all pages of application as filed.

PCT Application PCT/US20/56151 titled "Recurrent Neural Networks and Systems for Decoding Encoded Data" filed Oct. 16, 2020.

U.S. Appl. No. 16/683,217, titled "Recurrent Neural Networks and Systems for Decoding Encoded Data", filed Nov. 13, 2019.

U.S. Appl. No. 17/302,228, titled "Systems for Error Reduction of Encoded Data Using Neural Networks", filed Apr. 27, 2021.

Kim, Minhoe et al., "Building Encoder and Decoder With Deep Neural Networks: On the Way to Reality", Retrieved from <https://arxiv.org/abs/1808.02401>, dated Aug. 7, 2018, p. 4-5.

Lipton, Zachary C. et al., "A Critical Review of Recurrent Neural Networks for Sequence Learning", Retrieved from https://arxiv.org/abs/1506.00019v4, Oct. 17, 2015.

Huo et al. "A Tutorial and Review on Inter-Layer FEC Coded Layered Video Streaming" in IEEE Communications Survey & Tutorials, vol. 17, No. 2, 2nd Quarter 2015; pp. 1166-1207.

I. Wodiany and A. Pop "Low-Precision Neural Network Decoding of Polar Codes", 2019 IEEE 20th International Workshop on Signal Processing Advances in Wireless Communications (SPAWC), Cannes, FR; Jul. 2019 pp. all.

U.S. Appl. No. 18/179,317, filed Mar. 6, 2023 and titled, "Neural Networks and Systems for Decoding Encoded Data,", pp. all pages of application as filed.

Sun, Yang , et al., "VLSI Architecture for Layered Decoding of QC-LDPC Codes With High Circulant Weight" IEEE Transactions on Very Large Scale Integration (VLSI) Systems, vol. 21, No. 10, pp. 1960-1964, Oct. 2013.

Chang, Andre , et al., "Hardware Accelerators for Recurrent Neural Networks on FPGA", IEEE International Symposium on Circuits and Systems (ISCAS), 4 pgs, May 2017.

Kim, Minhoe , et al., "Toward the Realization of Encoder and Decoder Using Deep Neural Networks", IEEE Communications Magazine, vol. 57, No. 5, 7 pages, May 2019.

Nachmani, Eliya , et al., "RNN Decoding of Linear Block Codes", arxiv.org, Cornell University Library, 7 pgs, Feb. 2017.

Payani, Ali , et al., "Decoding LDPC Codes on Binary Erasure Channels Using Deep Recurrent Neural-Logic Layers", IEEE 10th International Symposium on Turbo Codes & Iterative Information Processing, 5 pgs, Dec. 2018.

(56) References Cited

OTHER PUBLICATIONS

Sandoval Ruiz, Cecilia, "FPGA Prototyping of Neuro-Adaptive Decoder", Advances in Computational Intelligence, Man-Machine Systems and Cybernetics, 6 pgs, Dec. 2010.

Soltani, Rohollah, et al., "Higher Order Recurrent Neural Networks", Retrieved May 31, 2023 from: https://arxiv.org/pdf/1605.00064.pdf, 9 pgs.

Teng, Chieh-Fang, et al., "Low-Complexity Recurrent Neural Network-Based Polar Decorder With Weight Quantization Mechanism", arxiv.org, Cornell University Library, 5 pgs, Oct. 2018.

* cited by examiner

DECODERS AND SYSTEMS FOR DECODING ENCODED DATA USING NEURAL NETWORKS

TECHNICAL FIELD

Examples described herein relate to neural networks, including recurrent neural networks, for use in decoding encoded data. Examples of neural networks are described which may be used with error-correcting coding (ECC), where a neural network may be used to facilitate decoding of encoded data by estimating message probability compute data.

BACKGROUND

Error correction coding (ECC) may be used in a variety of applications, such as memory devices or wireless baseband circuitry. Generally, error correction coding techniques may encode original data with additional bits to describe the original bits which are intended to be stored, retrieved, and/or transmitted. The additional bits may be stored together with the original bits. Accordingly, there may be L bits of original data to be stored and/or transmitted. An encoder may provide N-L additional bits, such that the encoded data may be N bits worth of data. The original bits may be stored as the original bits, or may be changed by the encoder to form the encoded N bits of stored data. A decoder may decode the N bits to retrieve and/or estimate the original L bits, which may be corrected in some examples in accordance with the ECC technique.

Bit flips (e.g., a change in charge at a memory cell) may occur in non-volatile memory devices. Thus, memory devices may operate with complex error correction techniques whose area and power needs are rising; resulting in higher cost silicon and longer firmware development times. For example, some aspects of decoding encoded data may impose additional area and power needs on a memory device.

DETAILED DESCRIPTION

Multi-layer neural networks and/or multi-layer recurrent neural networks may be used to decode encoded data (e.g., data encoded using one or more encoding techniques). Such neural networks may have nonlinear mapping and distributed processing capabilities which may be advantageous in many systems employing the neural network decoders. Some ECC decoders employ iterative decoding, e.g. a polar iterative decoding technique or a low-density parity-check code (LDPC) iterative decoding technique. Iterative decoding techniques and/or iterative encoding techniques generally refer to techniques where multiple rounds of computation are used to perform the decoding and/or encoding. For example, a first round of computation provides an intermediate result, which is again processed by the encoder and/or decoder to provide a further result. That further result may again be processed by the encoder and/or decoder, etc. Examples are described herein utilizing neural networks having nonlinear mapping and distributed processing capabilities, which may employ the advantages of neural networks in implementing decoders, including decoders using recurrent neural networks. In this manner, neural networks, including recurrent neural networks, described herein may be used to implement error correction coding (ECC) decoders.

Figure 1A:
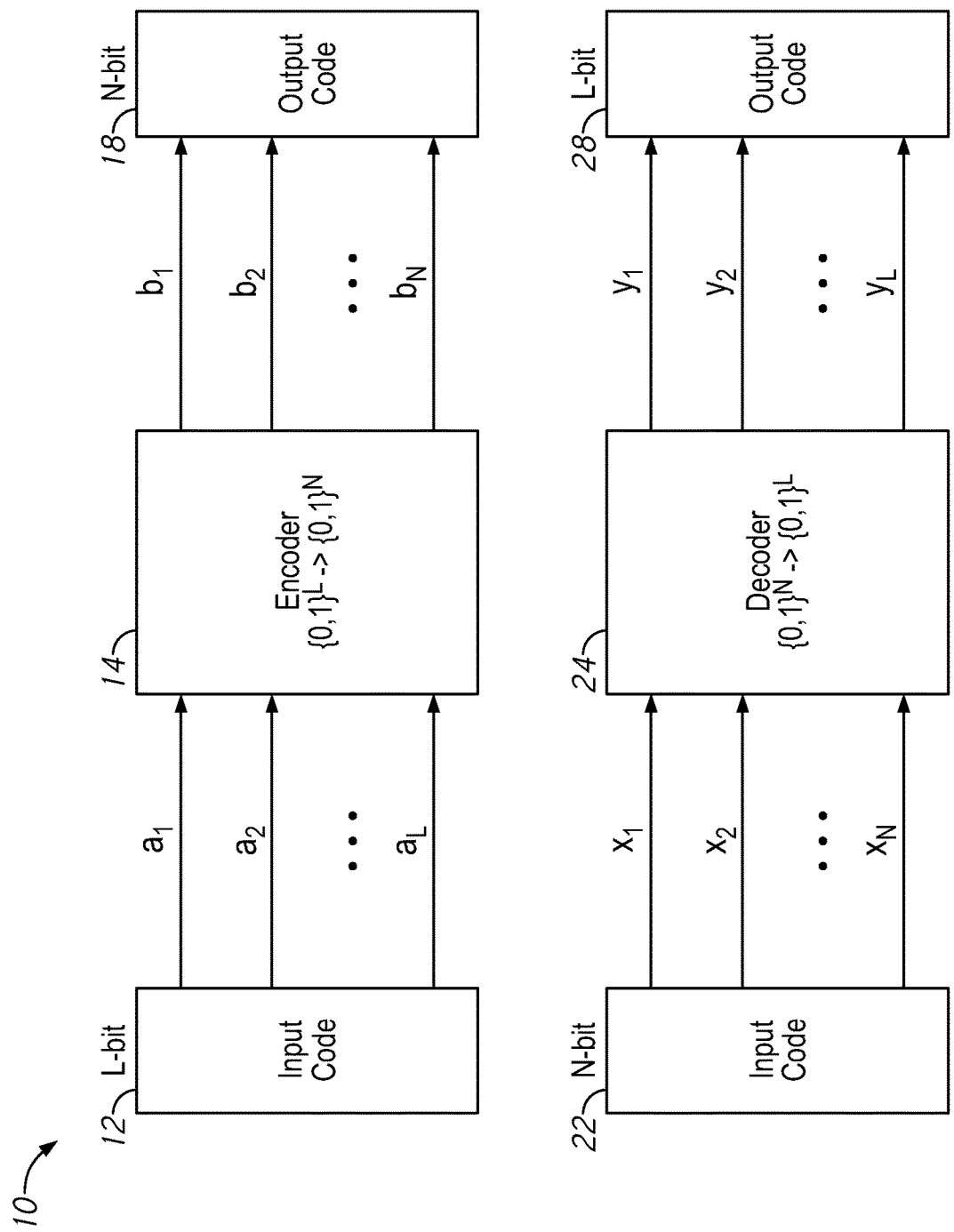
FIG. 1A is a schematic illustration of an ECC system arranged in accordance with examples described herein.

FIG. 1A is a schematic illustration of an ECC system arranged in accordance with examples described herein. In the ECC system 10, an encoder 14 may receive L bits of input data (a1, a2, . . . aL) 12. Any number of bits may be used as L. As part of ECC system 10, the encoder 14 may encode the input data in accordance with an encoding technique to provide N bits of encoded data as output code (b1, b2, . . . bN) 18. Any number of bits may be used as N—generally N may be greater than L. For example, as depicted in FIG. 1A, an encoder 14 may receive an L set of input data bits {0,1} and may encode the L bits into an N set of encoded data {0,1}. In some implementations, the encoded data may be stored and/or transmitted, or some other action taken with the encoded data, which may introduce noise into the data. Accordingly, in the ECC system 10, a decoder 24 may receive a version of the N bits of encoded data (x1, x2, . . . xN) as input code data 22. The N bits of encoded data (x1, x2, . . . xN) may correspond to the N bits of encoded data (b1, b2, . . . bN) output by the encoder, but with errors introduced. The errors may be introduced by storage and/or retrieval from memory and/or transmission to the decoder. The decoder 24 may decode the input code data 22 into an estimate of the L bits original data (a1, a2, . . . aL) as output data 28 (y1, y2, . . . yL). For example, as depicted in FIG. 1A, a decoder 24 may receive an N set of input encoded data bits {0,1} to decode the N bits as an L set of decoded data {0,1}.

Examples of wireless baseband circuitry may utilize error correction coding (such as low density parity check coding, LDPC). An encoder 14 may add particularly selected N-L bits into an original data of L bits, which may allow a decoder 24 to decode the data and reduce and/or minimize errors introduced by noise, interferences and/or other practical factors in the data storage and transmission.

There are a variety of particular error correction coding techniques, including low density parity check coding (LDPC), Reed-Solomon coding, Bose-Chaudhuri-Hocquenghem (BCH), and Polar coding. The use of these coding techniques, however, may come at the cost of the decrease of the frequency and/or channel and/or storage resource usage efficiency and the increase of the processing complexity. For example, the use of coding techniques may increase the amount of data which may be stored and/or transmitted. Moreover, processing resources may be necessary to implement the encoding and decoding. In some examples, decoders may include message probability computing (MPC) circuitry. For example, a decoder may implement one or more message passing techniques to perform decoding. For example, a decoder may implement an iterative decoding technique including multiple passes of computations through circuitry, including MPC circuitry. The use of message passing techniques, e.g., MPC circuitry, may cost significant computational resources in wireless baseband circuitry and/or memory controllers. The increased computational demand may reduce the desirability of existing decoding schemes (e.g., iterative decoding schemes) in many emerging applications such as Internet of Things (IoT) and/or tactile internet where ultra-low power consumption and ultra-low latency are highly desirable. Accordingly, there is a need to provide an MPC decoder that may reduce semiconductor area and/or power needs in wireless baseband circuitry and/or memory controllers.

Examples described herein utilize neural networks (NNs), such as multi-layer neural networks and/or multi-layer recurrent neural networks (RNNs) to perform the function of MPC circuitry, as if the encoded data was decoded iteratively, e.g., decoded using MPC circuitry. For example, a NN MPC may eliminate the need for multiple computational passes. For example, an NN MPC may not utilize a feedback error path otherwise used by MPC circuitry to provide feedback over multiple decoding iterations. Advantageously, using NNs and/or RNNs, which may have nonlinear mapping and distributed processing capabilities, ECC systems may utilize less semiconductor area space or reduced power needs, thereby allowing for the use of iterative decoding techniques in IoT applications and/or tactile internet. For example, in some non-volatile memory devices where bit flips may degrade memory storage capabilities, NNs and/or RNNs utilized to perform a function of MPC circuitry may provide a more robust decoder. The NN utilized to perform a function of MPC circuitry may be trained to transform encoded input data to an estimate of message probability compute data. The estimate of message probability compute data may be an estimate of (e.g., equivalent to) an output of several iterations of encoded data processed by MPC circuitry. In some examples, noise may be introduced in storing the encoded data in memory that is degraded (e.g., due to bit flips). In example implementations described herein, NN MPCs, including RNN MPCs, may estimate message probability compute data, to facilitate providing decoded data. The message probability compute data is representative of the encoded data as if the encoded data was iteratively decoded, e.g., by multiple passes through MPC circuitry.

Figure 1B:
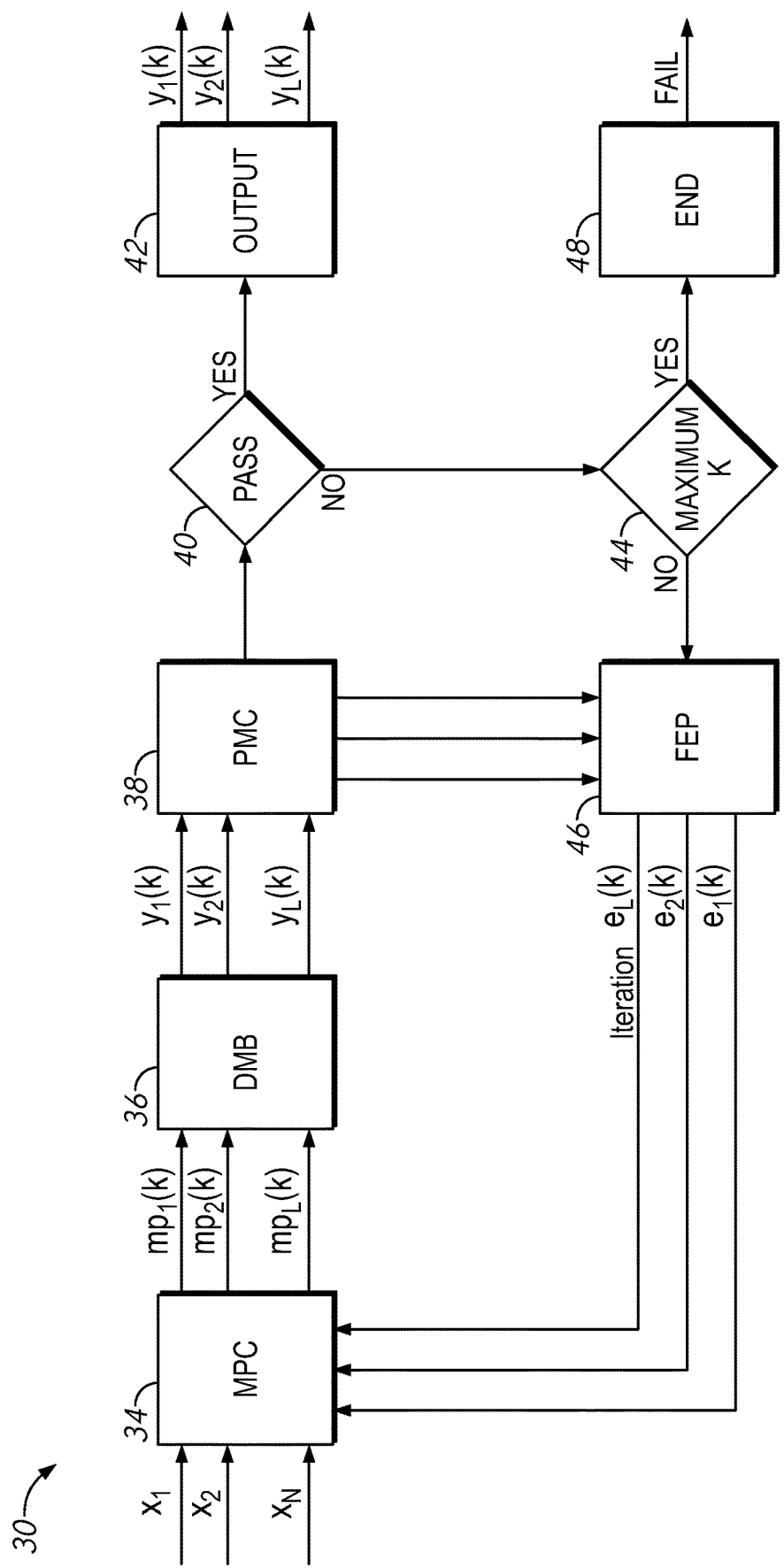
FIG. 1B is a schematic illustration of an example of Message Probability Computing (MPC) decoder.

FIG. 1B is a schematic illustration of an example Message Probability Computing (MPC) decoder 30. The MPC decoder 30 includes message probability computing (MPC) circuitry 34 that may receive N bits of encoded data (x1, x2, . . . xN) and a feedback error path (FEP) 46 that provides output based on feedback from another stage of the decoder. The MPC circuitry 34 uses, in part, the encoded data to generate message probability compute data (mp1, mp2, . . . mpL). In the computation at the MPC circuitry 34, the MPC circuitry 34 also uses output from a feedback error path (FEP) 46. The feedback error path (FEP) 46 may be implemented as a connection between an output of a parity matrix check (PMC) circuitry 38 and the MPC circuitry 34. The MPC circuitry 34 receives (e1, e, . . . eL). Using the output from the FEP 46 (e.g., the output of PMC circuitry 38) and the encoded data, the MPC circuitry 34 generates message probability compute data based on a combination (e.g., a difference) of the output from the FEP 46 and the encoded data. In an example calculation, the MPC data may be computed using Equation (0):

$$mp_i(k)=f(\alpha_{ij}mp_j(k-1)\beta_{ij}e_j(k-1),P) \qquad (0)$$

where $[e_1(k-1), e_2(k-1), \ldots eL(k-1)]$ is the output of FEP 46, $\alpha_{ij}$ and $\beta_{ij}$ are known parameters. P is a parametrized statistic set representative of prior probabilities or bit error rate (BER) factors related to a memory that the encoded data is retrieved from. For example, the BER factors may include voltage discrepancies, inter-cell interference/error, current disturbance, noises in the memory or bus coupled to the memory. Accordingly, the MPC circuitry 34 may generate message probability compute data based on a calculation including output from the FEP 46 and encoded data.

The MPC decoder 30 further includes decision-making block (DMB) circuitry 36 that receives the message probability compute data. The DMB circuitry 36 compares the message probability compute data with a predetermined threshold. The predetermined threshold may be representative of output indicative of decoded data. For example, the predetermined threshold may represent a parameter related to the average probability of each N bit of encoded data (b1, b2, . . . bN). In the example, the message probability compute data may include decimal values, e.g., output as float values from MPC circuitry 34. The DMB circuitry 36 may include a fixed value (e.g., 0.5) between 0 and 1 as the predetermined threshold. Continuing in the example, the DMB circuitry 36 compares each decimal value of the message probability compute data to the fixed value to output a binary value (e.g., a 0 bit or 1 bit) for each decimal value of the message probability compute data. The resulting bit values are output from the DMB circuitry 36 as the output indicative of decoded data. Accordingly, bit aspects of the message probability compute data set (mp1, mp2, . . . mpL) may be compared to the predetermined threshold. Based on the comparison to the predetermined threshold, the DMB circuitry 36 generates an estimate of the L bits of original data (y1, y2, . . . yL) (e.g., as output data 28 of FIG. 1A). Additionally or alternatively, while described above in the context of a single fixed value as the predetermined threshold to be compared at the DMB circuitry 36, the DMB circuitry 36 may use one or more fixed values, e.g., a different fixed value as the predetermined threshold for each kth iteration of the MPC decoder 30. For example, as described below with respect to the k-decision block 44, the DMB circuitry 36 may include a particular fixed value for each processing pass/iteration that occurs in the MPC decoder 30.

The MPC decoder 30 further includes parity matrix check (PMC) circuitry 38 that receives the estimate of the L bits of original data from the DMB circuitry 36. The PMC circuitry 38 applies the parity check matrix to the estimate of the L bits of original data received from the DMB circuitry 36. In comparing the estimate of the L bits of original data, the MPC decoder 30, using the PMC circuitry 38, performs a parity check of the estimate of the L bits of original data, to determine whether the data is the decoded data. In an example implementation, the PMC circuitry 38 may compare the estimate of the L bits of original data to a known parity check matrix, H. Accordingly, at decision block 40 of the MPC decoder 30, it is determined whether the estimate of the L bits of original data passes the parity check. If the parity check, performed by the PMC circuitry 38, passes at decision block 40, the flow proceeds along the "YES" path to output the estimate of the L bits of original data as the decoded data. In the example, accordingly, the MPC decoder 30 provides the decoded data as output 42. On the other hand, if the parity check does not pass at decision block 40, the flow proceeds along the "NO" path to k-decision block 44.

At k-decision block 44, the MPC decoder 30 determines whether k-iterations have occurred in the MPC decoder 30, with respect to the received N bits of encoded data (x1, x2, . . . xN). Each iteration may be referred to as one processing pass through MPC circuitry 34, DMB circuitry 36, and PMC circuitry 38. An output of the PMC 38 may be provided as feedback to the MPC circuitry 34 to begin a next iteration. In this manner, the MPC decoder 30, to decode encoded data, may iteratively process the encoded data. This may be referred to as an iterative decoding technique, such that the MPC decoder 30 operates as an iterative decoder for data encoded according to various encoding techniques, such as an LDPC encoding, Reed-Solomon encoding, BCH encoding, or polar encoding. Depending on the type of encoding, the MPC decoder 30 may use k iterations to decode the encoded data, where k is a number of iterations representative of a particular performance level for the MPC decoder. For example, an MPC decoder, using a maximum of k iterations, may decode most encoded data provided according to a particular encoding technique. Accordingly, if at k-decision block 44, the MPC decoder 30 has reached a maximum k iterations, flow proceeds along the "YES" path to end block 48 the iterative decoding of MPC decoder 30. In the example implementation, when the MPC decoder 30 arrives at end block 48, the MPC decoder 30 fails to decode the provided encoded data.

On the other hand, if at k-decision block 44, the MPC decoder 30 has not reached a maximum of k iterations, flow proceeds along the "NO" path to activate the FEP 46 to receive the estimate of the L bits of original data from the PMC circuitry 38. Upon an indication as to the decision of the k-decision block 44, the MPC decoder 30 uses the FEP 46 to provide the estimate of the L bits of original data as error data to the MPC circuitry 34, for further calculation with the encoded data. Accordingly, the MPC decoder 30 iteratively processes the encoded data with the error data until either there is an output 42 with decoded data or until a maximum of k-iterations are reached at k-decision block 44, in which case the MPC encoder fails at end block 48. Accordingly, the MPC decoder 30 iteratively decodes encoded data, to operate as an iterative decoder for a variety of encoding techniques. While described in the specific context of FIG. 1B, generally described, an MPC decoder may include any number of circuitries or components to implement aspects of MPC decoder 30, which generally operates to iteratively decode encoded data.

Figure 1C:
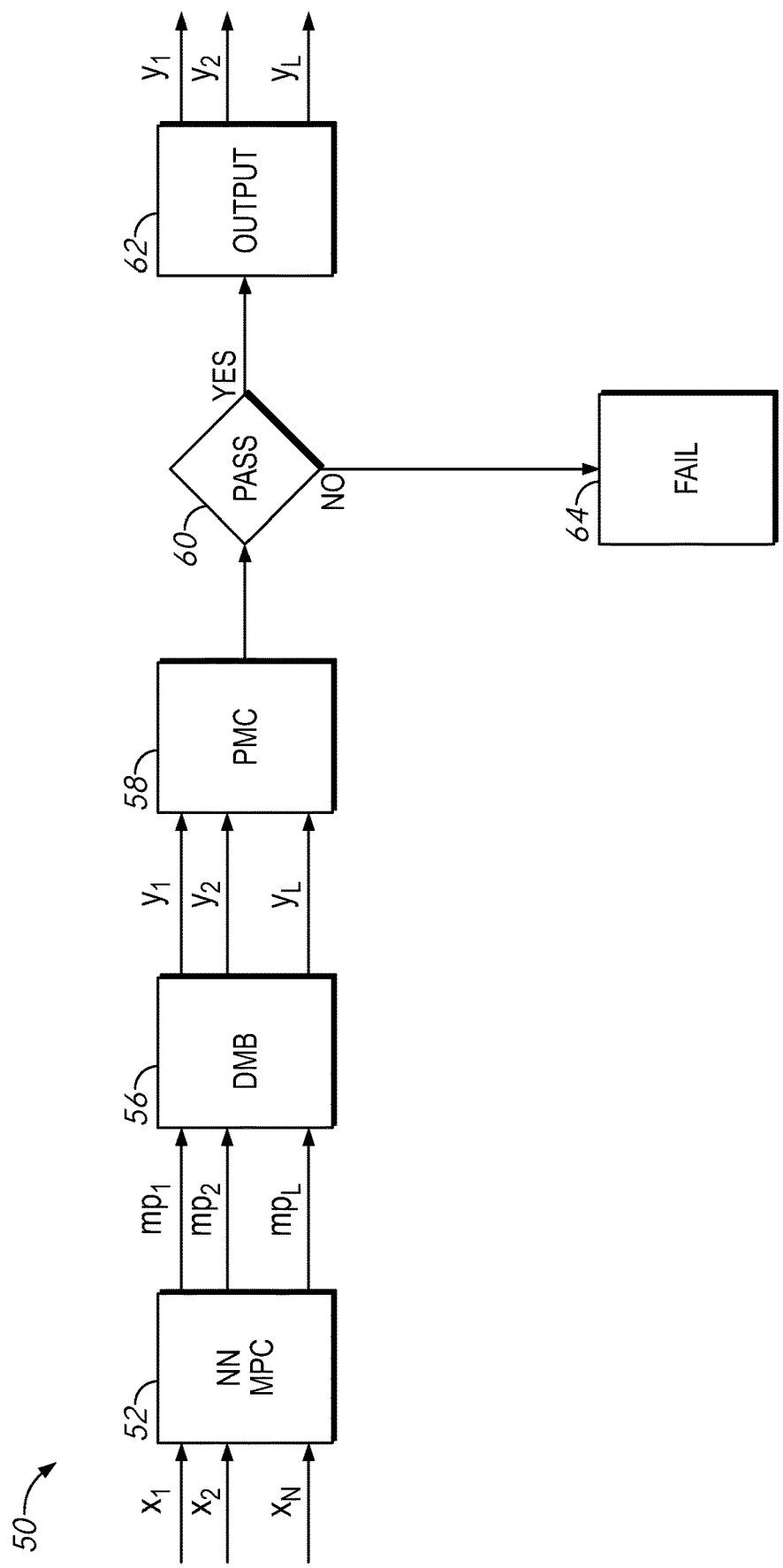
FIG. 1C is a schematic illustration of an example of Message Probability Computing (MPC) decoder arranged in accordance with examples described herein.

FIG. 1C is a schematic illustration of an example Message Probability Computing (MPC) decoder 50 arranged in accordance with examples described herein. Generally described, examples of MPC decoders described herein may not utilize the FEP 46 of MPC decoder 30. Instead, examples of MPC decoders described herein may utilize a neural network (NN) MPC 52, which eliminates the necessity of a FEP 46 or, generally, iterative decoding of an MPC decoder. Accordingly, the MPC decoder 50 decodes encoded data, as if the encoded data was iteratively decoded, e.g., in an MPC decoder 30. Similarly-named elements of FIG. 1C may operate as described with respect to FIG. 1B, but may also include additional features as described with respect to FIG. 1C. For example, FIG. 1C depicts DMB circuitry 56 and PMC circuitry 58, which may operate as described with respect to DMB 36 and PMC circuitry 38 of FIG. 1B. Accordingly, elements of FIG. 1C, including the aforementioned, decision block 60, and output 62—whose numerical indicator is offset by 20 with respect to FIG. 1B—operates similarly in the MPC decoder 30, but may also include additional features.

The MPC decoder 50 includes the NN MPC 52 that estimates message probability compute data based on received encoded data. Like the MPC decoder 30, the NN MPC 52 receives N bits of encoded data (x1, x2, . . . xN). In the example implementation, the encoded data may be any encoded data that is encoded in accordance with an encoding technique that uses an iterative decoding process. Accordingly, the NN MPC 52 is configured receive encoded data that uses an encoding technique associated with an iterative decoding. The NN MPC 52 may include any type of neural network, including examples of recurrent neural networks described herein.

Further, based on the received encoded data and weights acquired during a training process of the NN MPC 52, the NN MPC 52 estimates message probability compute data. Thus, the NN MPC 52 generates an estimate of the message probability compute data set (mp1, mp2, . . . mpL). The estimate of the message probability compute data set may be equivalent to output after processing of multiple iterations (e.g., k iterations) by a feedback error path associated with message probability compute circuitry in an iterative decoder. For example, the estimate generated by NN MPC 52 is equivalent to the output of MPC 34 after processing of k iterations by a FEP 46 in the MPC decoder 30. In this manner, a neural network may be used to implement NN MPC 52 which has been trained to receive encoded data and output message probability compute data which may be used to pass a parity matrix check operation. In the example of FIG. 1B, multiple iterations through the MPC circuitry may have been used to output message probability compute data that passes the parity matrix check. Multiple iterations may not be used in FIG. 1C, because the NN MPC 52 may be trained to estimate the successful message probability compute data based on the input encoded data.

Advantageously, the NN MPC 52 does not utilize output data from a feedback error path (e.g., FEP 46) because the NN MPC 52 does not compute the encoded data iteratively, e.g., according to a certain number of k iterations. Instead, the NN MPC 52 estimates message probability compute data, which is representative of the encoded data as if the encoded data were to be iteratively decoded, e.g., in an MPC decoder 30 of FIG. 1B operating as an iterative decoder.

The MPC decoder 50 further includes decision-making block (DMB) circuitry 56 that receives the message probability compute data. The DMB circuitry 56 compares the message probability compute data with a predetermined threshold. The predetermined threshold may be representative of output indicative of decoded data, such that the predetermine threshold is associated with an iterative decoding technique that generates decoded data. For example, the predetermined threshold may represent a parameter related to the average probability of each N bit of encoded data (b1, b2, . . . bN). In the example, the estimated message probability compute data may include decimal values, e.g., output as float values from NN MPC circuitry 52. The DMB circuitry 56 may include a fixed value (e.g., 0.5) between 0 and 1 as the predetermined threshold. Continuing in the example, the DMB circuitry 56 compares each decimal value of the estimated message probability compute data to the fixed value to output a binary value (e.g., a 0 bit or 1 bit) for each decimal value of the estimated message probability compute data. The resulting bit values are output from the DMB circuitry 56 as the output indicative of decoded data. Accordingly, bit aspects of the message probability compute data set (mp1, mp2, . . . mpL) may be compared to the predetermined threshold. Based on the comparison to the predetermined threshold, the DMB circuitry 56 generates an estimate of the L bits of original data (y1, y2, . . . yL) (e.g., as output data 28 of FIG. 1A).

The MPC decoder 50 further includes parity matrix check (PMC) circuitry 58 that receives the estimate of the L bits of original data from the DMB circuitry 56. The PMC circuitry 58 compares the estimate of the L bits of original data to a parity matrix. In comparing the estimate of the L bits of original data, the MPC decoder 50, using the PMC circuitry 58, performs a parity check of the estimate of the L bits of original data, to determine whether the data is the decoded data. In an example implementation, the PMC circuitry 58 may compare the estimate of the L bits of original data to a known parity check matrix, H. Accordingly, at decision block 60 of the MPC decoder 50, it is determined whether the estimate of the L bits of original data passes the parity check. If the parity check, performed by the PMC circuitry 58, passes at decision block 60, the flow proceeds along the "YES" path to output the estimate of the L bits of original data as the decoded data. In the example, accordingly, the MPC decoder 50 provides the decoded data as output 62. On the other hand, if the parity check does not pass at decision block 60, the flow proceeds along the "NO" path to end the MPC decoder 50. In the example implementation, when the MPC decoder 50 arrives at fail block 64, the MP decoder 50 fails to decode the provided encoded data.

Advantageously, the MPC decoder 50 may utilize less semiconductor area space or reduce power needs, relative to the decoder 30 of FIG. 1B, thereby allowing the use of a decoder associated with an iterative decoding techniques in IoT applications and/or tactile internet applications. For example, the NN MPC 52 may use less semiconductor area than the MPC circuitry with a feedback error path (e.g., like FEP 46) and/or other associated components to provide decisions like k-decision block 44 of MPC decoder 30. Additionally and advantageously, in using the NN MPC 52, the MPC decoder 50 may not use multiple iterations to decode encoded data. For example, each iteration in MPC decoder 30 may include an additional calculation of error data (e.g., the output of FEP 46) and input encoded data to decode the encoded data. Accordingly, by not using multiple iterations to decode data like the MPC decoder 30, the MPC decoder 50 may also reduce processing time to decode encoded data. In the example implementation, the NN MPC 52 includes weights to apply to the encoded data so that message probability compute data may be estimated in less than the processing time that the multiple iterative calculations used in an iterative decoding technique, like that of MPC decoder 30. Accordingly, the MPC decoder 30, in using the NN MPC 52, may improve processing time and reduce computational complexity for decoding encoded data.

Figure 1D:
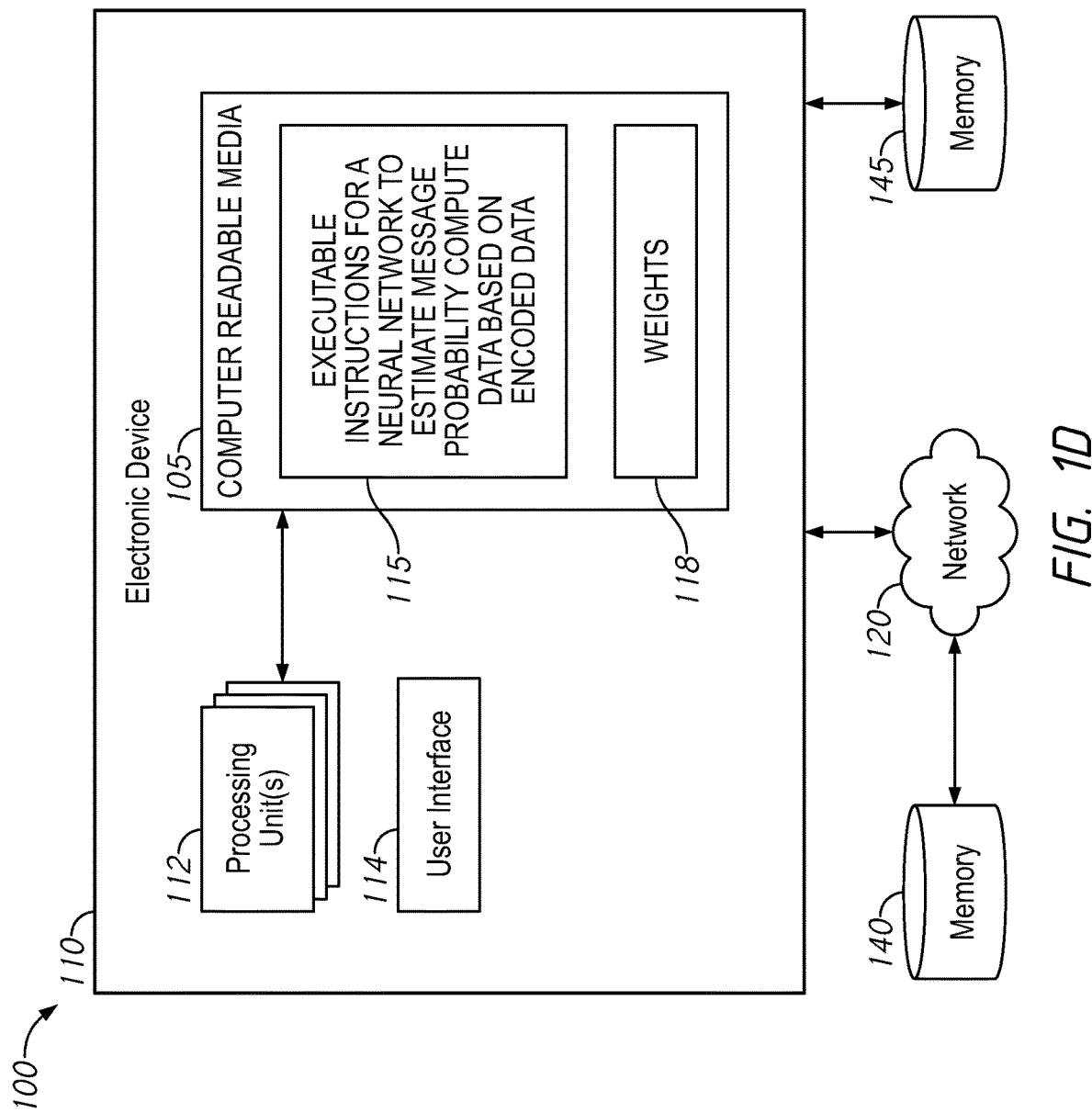
FIG. 1D is a schematic illustration of a computing system arranged in accordance with examples described herein.

FIG. 1D is a schematic illustration of an electronic device 110 arranged in a system 100 in accordance with examples described herein. The electronic device 110 may be coupled to a memory 140 via network 120 and/or may be coupled to and/or include memory 145, each of which may store coefficient data. For example, the coefficient data may be weights for a neural network or a recurrent neural network. Coefficient data stored in the memory 140 or memory 145 may include coefficient data which may be mixed with encoded input data received by the electronic device 110 in examples described herein. The encoded input data may also be stored in the memory 140 or 145. The electronic device 110 may obtain the encoded input data (e.g., N encoded input bits) from the memory 140 or memory 145 to decode the data to be output as decoded output data.

Electronic device 110 also includes processing circuitry 112 that may interact with computer readable media 105, which may be encoded with instructions executable by the processing circuitry 112, e.g., the executable instructions 115. In some implementations, computer readable media 105 may be implemented as a memory, which may include both storage media and communication media. Example computer readable media 105 may include volatile and nonvolatile, removable and non-removable media implemented in any method or technology for storage of information, such as computer readable instructions. The computer readable media 105 includes, stored therein, the executable instructions 115 for a neural network to estimate message probability compute data based on encoded data. For example, the executable instructions 115 may include instructions to select certain coefficient data (e.g., from memory 140 or memory 145) and to store the coefficient data as weights in weights memory 118 of the computer readable media 105. The executable instructions 115 may further include instructions to provide those weights 118 to one or more of the multiplication/accumulation units and/or memory look-up units of FIGS. 2A-2C whose details will be presented after describing FIGS. 1D-1F. As used herein, the weights 118 may be referred to as a plurality of coefficients or pluralities of coefficients (e.g., coefficient data). In some examples, the weights 118 stored in the computer readable media 105 may be used by a neural network implemented in the processing circuitry 112 (e.g., an NN MPC 52) to facilitate decoding encoded data that is associated with a particular encoding technique, as if the encoded data was iteratively decoded. The executable instructions 115 may include instructions to select certain coefficient data as weights 118 based on an indicated encoding technique. For example, header information or another flag associated with encoded input data (e.g., obtained from memory 140 or 145) may indicate a particular encoding technique. In the example, the executable instructions 115 may be executed to store certain weights 118 from the memory 140 or memory 145. Additionally, the executable instructions 115 may be executed to facilitate decoding of encoded input data into decoded data when the weights 118 are used by processing circuitry 112 implementing a neural network to estimate message probability compute data based on encoded data.

The processing circuitry 112 may be configured to implement an MPC decoder 50, including the NN MPC 52. In an example, the processing circuitry 112 may implement the NN MPC 52 component of an MPC decoder 50 or any ECC decoder. Continuing in the example, the processing circuitry 112 may interact with an MPC decoder or ECC decoder implemented on the electronic device 110 to perform an MPC functionality for the MPC decoder, e.g., by implementing the NN MPC 52.

The processing circuitry 112 may be implemented using one or more processors, for example, having any number of cores. In some examples, the processing circuitry 112 may include custom circuitry, and/or firmware for performing functions described herein. The processing circuitry 112 can include multiplication unit/accumulation units for performing the described functions, as described herein, e.g., for a neural network to estimate message probability compute data based on encoded data. Processing circuitry 112 can be any type including but not limited to a microprocessor or a digital signal processor (DSP), or any combination thereof. For example, processing circuitry 112 can include levels of caching, such as a level one cache and a level two cache, a core, and registers. An example processor core can include an arithmetic logic unit (ALU), a bit manipulation unit, a multiplication unit, an accumulation unit, an adder unit, a look-up table unit, a memory look-up unit, or any combination thereof. Examples of processing circuitry 112 are described herein, for example with reference to FIG. 2A, 2B, or 2C.

The computer readable media 105, for example, may be encoded with executable instructions 115 for a neural network to estimate message probability compute data based on encoded data. at the processing circuitry 112. For example, in the context of decoding encoded input data from memory 140 or 145, the executable instructions 115 for a neural network to estimate message probability compute data based on encoded data may include instructions for obtaining the encoded input data from the memory 140 or 145; and to transform that obtained encoded input data at the processing circuitry 112 into decoded data, including estimating the message probability compute data by a NN MPC 52. For example, the executable instructions 115 for a neural network to estimate message probability compute data based on encoded data. may further include instructions for multiplying a portion of the encoded input data with coefficient data (e.g., the weights 118) to generate a coefficient multiplication result and accumulating the coefficient multiplication result to be further multiplied and accumulated with another portion of the encoded input data and coefficient data, examples of which are described herein. For example, to generate a coefficient multiplication result, a first layer of multiplication/accumulation processing units (MAC units) may calculate the encoded input data with the plurality of coefficients to generate such coefficient multiplication results, or first processing results of the first layer of MAC units. Continuing in the example, to provide the output data, additional layers of MAC units may calculate the first processing results with additional pluralities of coefficients to generate additional coefficient multiplication results, or second processing results of the additional layers of MAC units. The MLUs of a last layer of the additional layers of MAC units may provide the estimate of the message probability compute data based on the second processing results. Accordingly, the executable instructions 115 for a neural network to estimate message probability compute data based on encoded data. may include various sets of executable instructions for different types of hardware implementations, such as those shown in FIGS. 2A-2C, to implement such computing of encoded input data with coefficient data (e.g., the weights 118).

The user interface 114 may be implemented with any of a number of input devices including, but not limited to, a touchscreen, keyboard, mouse, microphone, or combinations thereof. The user interface 114 may receive input from a user, for example, regarding decoding certain encoded data at the processing circuitry 112. The user interface 114 may communicate the user input to the computer readable media 105. Example user interfaces 114 include a serial interface controller or a parallel interface controller, which may be configured to communicate with external input devices (e.g., keyboard, mouse, pen, voice input device, touch input device, etc.).

The network 120 may include a wired network or direct-wired connection, and wireless media such as acoustic, radio frequency (RF), microwave, infrared (IR) and other wireless media.

The memory(s) 140, and 145 (or computer readable media 105, if being implemented as a memory) may be implemented using any storage medium accessible to the processing circuitry 112. For example, RAM, ROM, solid state memory, flash memory, disk drives, system memory, optical storage, or combinations thereof, may be used to implement the computer readable media 105 or memory(s) 140, and 145. In storing encoded data in memories 140 or 145, environmental or other noise may be introduced in the storing process. For example, noise may be introduced in storing the encoded data in memory 140 or 145 that is degraded (e.g., due to bit flips). Accordingly, data obtained from the memory(s) 140 or 145 may be referred to as noisy encoded input data. In some implementations, the computer readable media 105 may store associations between coefficients and particular encoding techniques described herein, e.g., such that the executable instructions 115 may utilize the associations to select certain coefficient data in memories 140 or 145 as the weights 118.

The electronic device 110 may be implemented using any of a variety of computing systems, including but not limited to one or more desktop, server, laptop, or other computers. The electronic device 110 generally includes processing circuitry 112. The computing system 100 may be implemented as a mobile communication device using any user communication device, including but not limited to, a desktop, laptop, cellular phone, tablet, appliance, automobile, or combinations thereof. The electronic device 110 may be programmed with a mobile application (e.g. processing circuitry 112 and computer readable media 105 encoded with instructions 115 which, when executed, cause the electronic device 110 to perform described functions) for a neural network to estimate message probability compute data. For example, the electronic device 110 may be programmed to receive an indication from a touchscreen of a mobile communication device that certain encoded data received in a 5G wireless transmission is to be decoded in an MPC decoder (e.g., an MPC decoder 50) implemented at the processing circuitry 112.

It is to be understood that the arrangement of computing systems of the system 100 may be quite flexible, and although not shown, it is to be understood that the system 100 may include many electronic devices 110, which may be connected via the network 120 can operate in conjunction with each other to perform the systems and methods described herein. The memory 145 and/or the memory 140 may in some examples be implemented using the same media, and in other examples may be implemented using different media. For example, while the memory 140 is shown in FIG. 1D as coupled to the network 120, it can be appreciated that the memory 140 may also be implemented electronic device 110 as part of the computer readable media 105. Additionally, while a single user interface 114 is shown in FIG. 1D, it can be appreciated that the electronic device 110 may further include any number of input devices, output devices, and/or peripheral components. For example, the user interface 114 may be the interface of a mobile communication device.

Figure 1E:
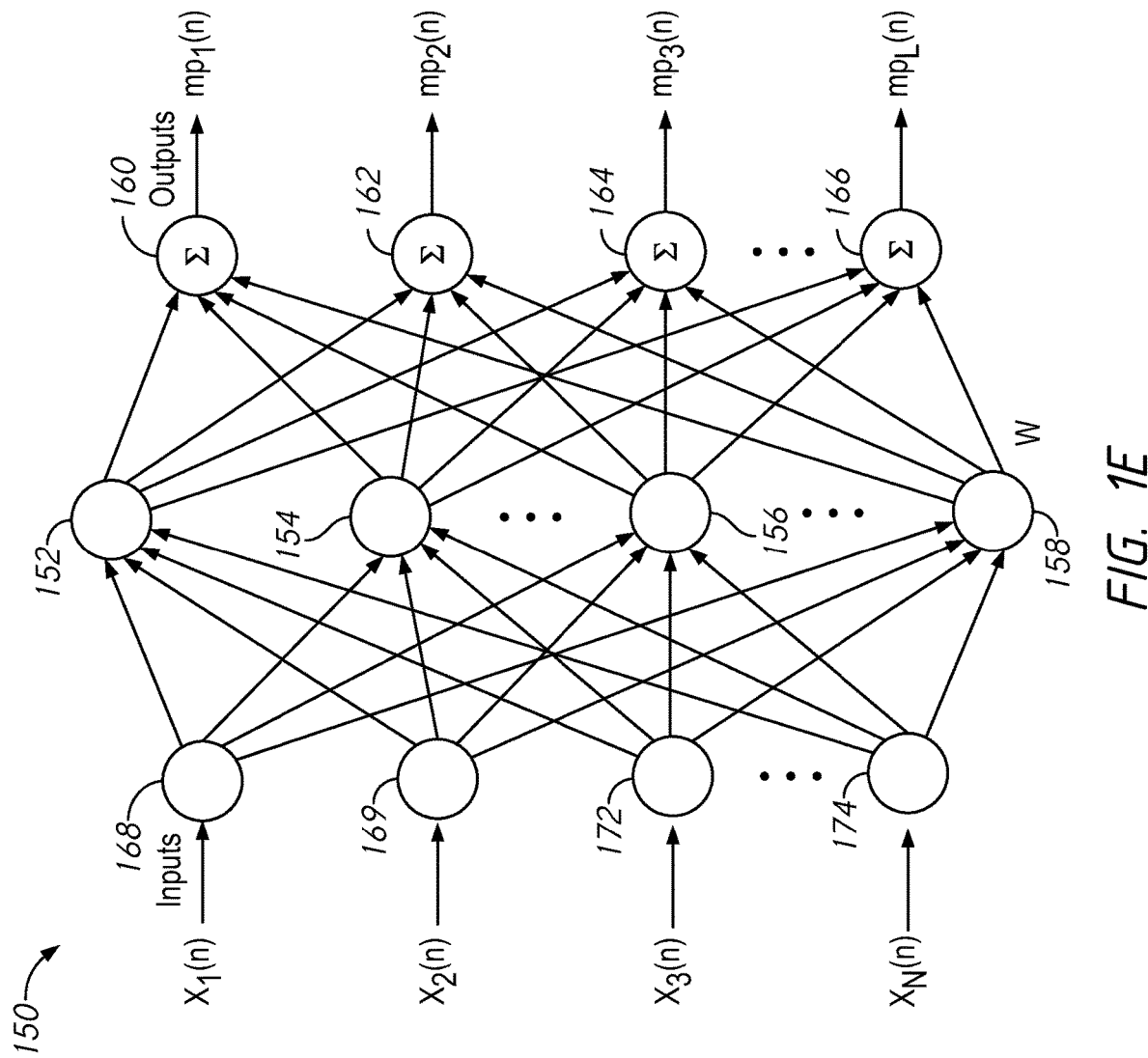
FIG. 1E is a schematic illustration of a neural network arranged in accordance with examples described herein.

FIG. 1E is a schematic illustration of a neural network arranged in accordance with examples described herein. The neural network 150 include three stages (e.g., layers). While three stages are shown in FIG. 1E, any number of stages may be used in other examples. A first stage of neural network 150 includes node 168, node 169, node 172, and node 174. A second stage of neural network 150 includes combiner 152, combiner 154, combiner 156, and combiner 158. A third stage of neural network 150 includes combiner 160, combiner 162, combiner 164, and combiner 166. Additional, fewer, and/or different components may be used in other examples.

Generally, a neural network may be used including multiple stages of nodes. The nodes may be implemented using processing circuitry 112 which may execute one or more functions on inputs received from a previous stage and provide the output of the functions to the next stage of the neural network. The processing units may be implemented using, for example, one or more processors, controllers, and/or custom circuitry, such as an application specific integrated circuit (ASIC) and/or a field programmable gate array (FPGA). In some examples, the processing units may be implemented using any combination of one or more processing units described with respect to FIGS. 2A-2C. Details of example implementations of neural network 150, in the context of FIGS. 2A-2C, will be presented in the description of FIGS. 2A-2C. The processing units may be implemented as combiners and/or summers and/or any other structure for performing functions allocated to the processing unit. In some examples, certain of the elements of neural networks described herein perform weighted sums, e.g., may be implemented using one or more multiplication/accumulation units, which may be implemented using processor(s) and/or other circuitry. In an example, the neural network 150 may be implemented by the electronic device 110.

In the example, of FIG. 1E, the neural network 150 may have an input layer, which may be a first stage of the neural network including node 168, node 169, node 172, and node 174. The nodes node 168, node 169, node 172, and node 174 may implement a linear function which may provide the input signals (e.g., $x1(n)$, $x2(n)$, ... $xN(n)$) to another stage of the neural network (e.g., a 'hidden stage' or 'hidden layer'). Accordingly, in the example of FIG. 1E, N bits of encoded input data may be provided to an input stage (e.g., an input layer) of a neural network during operation. In some examples, the input data may be data encoded in accordance with an encoding technique (e.g., low density parity check coding (LDPC), Reed-Solomon coding, Bose-Chaudhuri-Hocquenghem (BCH), and/or Polar coding). The N bits of input data may be output by the first stage of the neural network 150 to a next stage of the neural network 150. In some examples, the connection between the first stage and the second stage of the neural network 150 may not be weighted—e.g., processing units in the second stage may receive unaltered bits from the first stage in some examples. Each of the input bit may be provided to multiple ones of the processing units in the next stage. While an input layer is shown, in some examples, the input layer may not be present.

The nodes node 168, node 169, node 172, and node 174 may be implemented, for example, using bit manipulation units that may forward the signals $x_1(n)$, $x_2(n)$, $x_3(n)$, $x_N(n)$ to combiner 152, combiner 154, combiner 156, and combiner 158, respectively. In some implementations, a bit manipulation unit may perform a digital logic operation on a bitwise basis. For example, a bit manipulation unit may be a NOT logic unit, an AND logic unit, an OR logic unit, a NOR logic unit, a NAND logic unit, or an XOR logic unit.

The neural network 150 may have a next layer, which may be referred to as a 'hidden layer' in some examples. The next layer may include combiner 152, combiner 154, combiner 156, and combiner 158, although any number of elements may be used. While the processing elements in the second stage of the neural network 150 are referred to as combiners, generally the processing elements in the second stage may perform a nonlinear activation function using the input data bits received at the processing element. Combiner 152, combiner 154, combiner 156, and combiner 158 may be implemented, for example, using multiplication units that include a nonlinear vector set (e.g., center vectors) based on a nonlinear activation function. Any number of nonlinear activation functions may be used. Examples of functions which may be used include Gaussian functions, such as $$f(r) = \exp\left(-\frac{r^2}{\sigma^2}\right).$$

Examples of functions which may be used include multi-quadratic functions, such as $f(r)=(r^2+\sigma^2)^{1/2}$. Examples of functions which may be used include inverse multi-quadratic functions, such as $f(r)=(r^2+\sigma^2)^{-1/2}$. Examples of functions which may be used include thin-plate-spline functions, such as $f(r)=r^2 \log(r)$. Examples of functions which may be used include piece-wise linear functions, such as $f(r)=\frac{1}{2}(|r+1|-|r-1|)$. Examples of functions which may be used include cubic approximation functions, such as $f(r)=\frac{1}{2}(|r^3+1|-|r^3-1|)$. In these example functions, a represents a real parameter (e.g., a scaling parameter) and r is the distance between the input vector and the current vector. The distance may be measured using any of a variety of metrics, including the Euclidean norm.

Each element in the 'hidden layer' may receive as inputs selected bits (e.g., some or all) of the input data. For example, each element in the 'hidden layer' may receive as inputs from the output of multiple selected elements (e.g., some or all elements) in the input layer. For example, each element in the 'hidden layer' may receive as inputs from the output of multiple selected units (e.g., some or all units) in the input layer. For example, the combiner 152 may receive as inputs the output of node 168, node 169, node 172, and node 174. While a single 'hidden layer' is shown by way of example in FIG. 1E, any number of 'hidden layers' may be present and may be connected in series. While four elements are shown in the 'hidden layer', any number may be used, and they may be the same or different in number than the number of nodes in the input layer and/or the number of nodes in any other hidden layer. The nodes in the hidden layer may evaluate at least one non-linear function using combinations of the data received at the hidden layer node (e.g., element). In this manner, the hidden layer may provide intermediate data at an output of one or more hidden layers.

The neural network 150 may have an output layer. The output layer in the example of FIG. 1E may include combiner 160, combiner 162, combiner 164, and combiner 166, although any number of elements may be used. While the processing element in the output stage of the neural network 150 are referred to as combiners, generally the processing elements in the output may perform any combination or other operation using data bits received from a last 'hidden layer' in the neural network. Each element in the output layer may receive as inputs selected bits (e.g., some or all) of the data provided by a last 'hidden layer'. For example, the combiner 160 may receive as inputs from the outputs of combiner 152, combiner 154, combiner 156, and combiner 158. The connections between the hidden layer and the output layer may be weighted. For example, a set of weights W may be specified. There may be one weight for each connection between a hidden layer node and an output layer node in some examples. In some examples, there may be one weight for each hidden layer node that may be applied to the data provided by that node to each connected output node. Other distributions of weights may also be used. The weights may be multiplied with the output of the hidden layer before the output is provided to the output layer. In this manner, the output layer may perform a sum of weighted inputs. Accordingly, an output of the neural network 150 (e.g., the outputs of the output layer) may be referred to as a weighted sum. The output layer may accordingly combine intermediate data received from one or more hidden layers using weights to provide output data.

In some examples, the neural network 150 may be used to provide L output bits which represent processed data corresponding to N input bits. For example, in the example of FIG. 1E, N input bits are shown ($x_1(n)$, $x_2(n)$, ... $x_N(n)$) and L output bits are provided ($mp_1(n)$, $mp_2(n)$, ... $mp_L(n)$). As described herein, the L output bits may be message probability compute data. In an example implementation, the neural network 150 may estimate the message probability compute data, e.g., the estimated message probability compute data is equivalent to output from an Message Probability Compute circuitry (e.g., MPC 34 of FIG. 1B) based on data decoded, after a certain number of iterations, using a feedback error path (e.g., FEP 46 of FIG. 1B) in an iterative decoder (e.g., MPC decoder 30 of FIG. 1B). The neural network 150 may be trained such that the weights W used and/or the functions provided by the elements of the hidden layers cause the neural network 150 to provide output bits which represent the processed data corresponding to the N encoded input bits. The input bits may have been encoded with an encoding technique, and the weights and/or functions provided by the elements of the hidden layers may be determined based on the iteratively computed message probability compute data of an iterative decoder associated with a certain encoding technique. Accordingly, the neural network 150 may be trained multiple times—once for each encoding technique that may be used to provide the neural network 150 with input data.

Examples of neural networks may be trained. Training generally refers to the process of determining weights, functions, and/or other attributes to be utilized by a neural network to create a desired transformation of input data to output data. In some examples, neural networks described herein may be trained to transform encoded input data to message probability compute data. In some examples, neural networks described herein may be trained to transform encoded input data to decoded data using an estimate of message probability compute data.

Training as described herein may be supervised or unsupervised in various examples. In some examples, training may occur using known pairs of anticipated input and desired output data. For example, training may utilize known encoded data and known message probability compute data pairs to train a neural network to decode subsequent encoded data into decoded data. In some examples, training may utilize known encoded data and known message probability compute data pairs to train a neural network to decode subsequent noisy encoded data into decoded data. Examples of training may include determining weights to be used by a neural network, such as neural network 150 of FIG. 1E. In some examples, the same neural network hardware is used during training as will be used during operation. In some examples, however, different neural network hardware may be used during training, and the weights, functions, or other attributes determined during training may be stored for use by other neural network hardware during operation.

Examples of training can be described mathematically. For example, consider input data at a time instant (n), given as: $X(n)=[x_1(n), x_2(n), \ldots x_N(n)]^T$. The center vector for each element in hidden layer(s) of the neural network 150 (e.g., combiner 152, combiner 154, combiner 156, and combiner 158) may be denoted as $C_i$ (for i=1, 2, ..., H, where H is the element number in the hidden layer).

The output of each element in a hidden layer may then be given as:

$$h_i(n)=f_i(\|X(n)-C_i\|) \text{ for } (i=1,2,\ldots,H) \quad (1)$$

The connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$mp_i(n)=\sum_{j=1}^{H}W_{ij}h_j(n)=\sum_{j=1}^{H}W_{ij}f_j(\|X(n)-C_i\|) \quad (2)$$

for (i=1, 2, ..., L) and where L is the element number of the output of the output layer and $W_{ij}$ is the connection weight between the j'th element in the hidden layer and the i'th element in the output layer.

Generally, a neural network architecture (e.g., the neural network 150 of FIG. 1E) may include a number of elements and may have center vectors which are distributed in the input domain such that the neural network may approximate nonlinear multidimensional functions and therefore may approximate forward mapping an inverse mapping between two data types (e.g., from an N-bit input encoded data to an L-bit output message probability compute data). Generally, the choice of transfer function used by elements in the hidden layer may not affect the mapping performance of the neural network, and accordingly, a function may be used which may be implemented conveniently in hardware in some examples. For example, a thin-plate-spline function and/or a Gaussian function may be used in various examples and may both provide adequate approximation capabilities. Other functions may also be used.

Examples of neural networks may accordingly be specified by attributes (e.g., parameters). In some examples, two sets of parameters may be used to specify a neural network: connection weights and center vectors (e.g., thresholds). The parameters may be determined from selected input data (e.g., encoded input data) by solving an optimization function. An example optimization function may be given as:

$$E=\sum_{n=1}^{M}\|Y(n)-\overline{Y(n)}\|^2 \quad (3)$$

where M is a number of trained input vector (e.g., trained encoded data inputs) and Y(n) is an output vector computed from the sample input vector using Equations (1) and (2) above, and $\overline{Y(n)}$ is the corresponding desired (e.g., known) output vector. The output vector Y(n) may be written as:

$$Y(n)=[y_1(n),y_2(n),\ldots y_L(n)]^T$$

Various methods (e.g., gradient descent procedures) may be used to solve the optimization function. However, in some examples, another approach may be used to determine the parameters of a neural network, which may generally include two steps—(1) determining center vectors $C_i$ (i=1, 2, ..., H) and (2) determining the weights.

In some examples, the center vectors may be chosen from a subset of available sample vectors. In such examples, the number of elements in the hidden layer(s) may be relatively large to cover the entire input domain. Accordingly, in some examples, it may be desirable to apply k-means cluster algorithms. Generally, k-means cluster algorithms distribute the center vectors according to the natural measure of the attractor (e.g., if the density of the data points is high, so is the density of the centers). k-means cluster algorithms may find a set of cluster centers and partition the training samples into subsets. Each cluster center may be associated with one of the H hidden layer elements in this network. The data may be partitioned in such a way that the training points are assigned to the cluster with the nearest center. The cluster center corresponding to one of the minima of an optimization function. An example optimization function for use with a k-means cluster algorithm may be given as:

$$E_{k\_means} = \Sigma_{j=1}^{H} \Sigma_{n=1}^{M} B_{jn} \|X(n) - C_j\|^2 \qquad (4)$$

where $B_{jn}$ is the cluster partition or membership function forming an H×M matrix. Each column may represent an available sample vector (e.g., known input data) and each row may represent a cluster. Each column may include a single '1' in the row corresponding to the cluster nearest to that training point, and zeros elsewhere.

The center of each cluster may be initialized to a different randomly chosen training point. Then each training example may be assigned to the element nearest to it. When all training points have been assigned, the average position of the training point for each cluster may be found and the cluster center is moved to that point. The clusters may become the desired centers of the hidden layer elements.

In some examples, for some transfer functions (e.g., the Gaussian function), the scaling factor σ may be determined, and may be determined before determining the connection weights. The scaling factor may be selected to cover the training points to allow a smooth fit of the desired network outputs. Generally, this refers to any point within the convex hull of the processing element centers may significantly activate more than one element. To achieve this goal, each hidden layer element may activate at least one other hidden layer element to a significant degree. An appropriate method to determine the scaling parameter a may be based on the P-nearest neighbor heuristic, which may be given as, $$\sigma_i = \frac{1}{P} \sum_{j=1}^{P} \|C_j - C_i\|^2 (i = 1, 2, \ldots \ldots, H)$$

where $C_j$ (for i=1, 2, ..., H) are the P-nearest neighbors of $C_i$.

The connection weights may additionally or instead be determined during training. In an example of a neural network, such as neural network 150 of FIG. 1E, having one hidden layer of weighted connections an output elements which are summation units, the optimization function of Equation (3) may become a linear least-squares problem once the center vectors and the scaling parameter have been determined. The linear least-squares problem may be written as $$\min_{W} \sum_{n=1}^{M} \|Y(n) - \widetilde{Y(n)}\|^2 = \min_{W} \sum_{n=1}^{m} \|WF - \hat{Y}\|^2 \qquad (5)$$

where W={Wij} is the L×H matrix of the connection weights, F is an H×M matrix of the outputs of the hidden layer processing elements and whose matrix elements are computed using $F_{in}=f_i(\|X(n)-C_i\|)$ (i=1, 2, ..., H; n=1, 2, ..., M) and $\hat{Y} = [\hat{Y}(1), \hat{Y}(2), \ldots, \hat{Y}(M)]$ is the L×M matrix of the desired (e.g., known) outputs. The connection weight matrix W may be found from Equation (5) and may be written as follows:

$$\hat{W} = \hat{Y}F^+ = \hat{Y} \lim_{\alpha \to 0} F^T(FF^T + \alpha I)^{-1} \qquad (6)$$

where F⁺ is the pseudo-inverse of F. In this manner, the above may provide a batch-processing method for determining the connection weights of a neural network. It may be applied, for example, where all input sample sets are available at one time. In some examples, each new sample set may become available recursively, such as in the recursive-least-squares algorithms (RLS). In such cases, the connection weights may be determined as follows.

First, connection weights may be initialized to any value (e.g., random values may be used). The output vector Y(n) may be computed using Equation (2). The error term $e_i(n)$ of each output element in the output layer may be computed as follows:

$$e_i(n) = y_i(n) - \widetilde{y}_i(n) (i=1,2, \ldots, L)$$

The connection weights may then be adjusted based on the error term, for example as follows:

$$W_{ij}(n+1) = W_{ij}(n) + \gamma e_i(n) f_j(\|X(n) - C_j\|) \qquad (7)$$

(i=1, 2, ..., L; j=1, 2, ..., M)

where γ is the learning-rate parameter which may be fixed or time-varying.

The total error may be computed according to the output from the output layer and the desired (known) data:

$$\epsilon = \|Y(n) - \widetilde{Y(n)}\|^2 \qquad (8)$$

The process may be iterated by again calculating a new output vector, error term, and again adjusting the connection weights. The process may continue until weights are identified which reduce the error to equal to or less than a threshold error.

Accordingly, the neural network 150 of FIG. 1E may be trained to determine parameters (e.g., weights) for use by the neural network 150 to perform a particular mapping between input encoded data and output message probability compute data. For example, training the neural network 150 may provide one set of parameters (e.g., weights) to use when decoding encoded data that had been encoded with a particular encoding technique (e.g., low density parity check coding (LDPC), Reed-Solomon coding, Bose-Chaudhuri-Hocquenghem (BCH), and/or Polar coding). The neural network 150 (and/or another neural network) may be trained multiple times, using different known input/output data pairs, for example. Multiple trainings may result in multiple sets of connection weights. For example, a different set of weights may be determined for each of multiple encoding techniques—e.g., one set of weights may be determined for use with decoding LDPC encoded data and another set of weights may be determined for use with decoding BCH encoded data. Accordingly, in various implementations, the various sets of weights may correspond to weights used to estimate message probability compute data based on encoded data, to facilitate provided decoded data in an MPC decoder, such as MPC decoder 50 of FIG. 1C.

Recall that the structure of neural network 150 of FIG. 1E is provided by way of example only. Other multilayer neural network structures may be used in other examples. For example, as described below with respect to FIG. 1F, a multilayer recurrent neural network structure may be utilized as disclosed herein. Moreover, the training procedures described herein are also provided by way of example. Other training techniques (e.g., learning algorithms) may be used, for example, to solve the local minimum problem and/or vanishing gradient problem. Determined weights and/or vectors for each decoder may be obtained by an off-line learning mode of the neural network, which may advantageously provide more resources and data. In some implementations, for example as described with reference to FIGS. 2A-2C, the hidden layers of combiners (e.g., combiner 152, combiner 154, combiner 156, and combiner 158) may include multiplication/accumulation (MAC) units, with each layer having additional MAC units. Such implementations, having accumulated the intermediate processing results in a respective processing elements (e.g., the respective MAC unit), may also include memory look-up (MLU) units that are configured to retrieve a plurality of coefficients and provide the plurality of coefficients as the connection weights (e.g., determined weights) for that respective layer of MAC units to be mixed with the input data.

In examples of supervised learning, the input training samples: $[x_1(n), x_2(n), \ldots, x_m(n)]$ may be generated by passing the encoded samples $[b_1(n), b_2(n), \ldots b_m(n)]$ through some noisy channels and/or adding noise. The supervised output samples may be the corresponding original code $[a_1(n), a_2(n), \ldots a_L(n)]$ which may be used to generate $[b_1(n), b_2(n), \ldots b_m((n)]$ by the encoder. Once these parameters are determined in offline mode, the desired decoded code-word can be obtained from input data utilizing the neural network (e.g., computing Equation (2)), which may avoid complex iterations and feedback decisions used in traditional error-correcting decoding algorithms. In this manner, neural networks described herein may provide a reduction in processing complexity and/or latency, because some complexity has been transferred to an off-line training process which is used to determine the weights and/or functions which will be used. Further, the same neural network (e.g., the neural network 150 of FIG. 1E) can be used to estimate message probability compute data based on an input code-word encoded from any of multiple error correction encoder by selecting different weights that were obtained by the training for the particular error correction technique employed. In this manner, neural networks may serve as a Message Probability Compute circuitry for multiple encoding techniques.

Figure 1F:
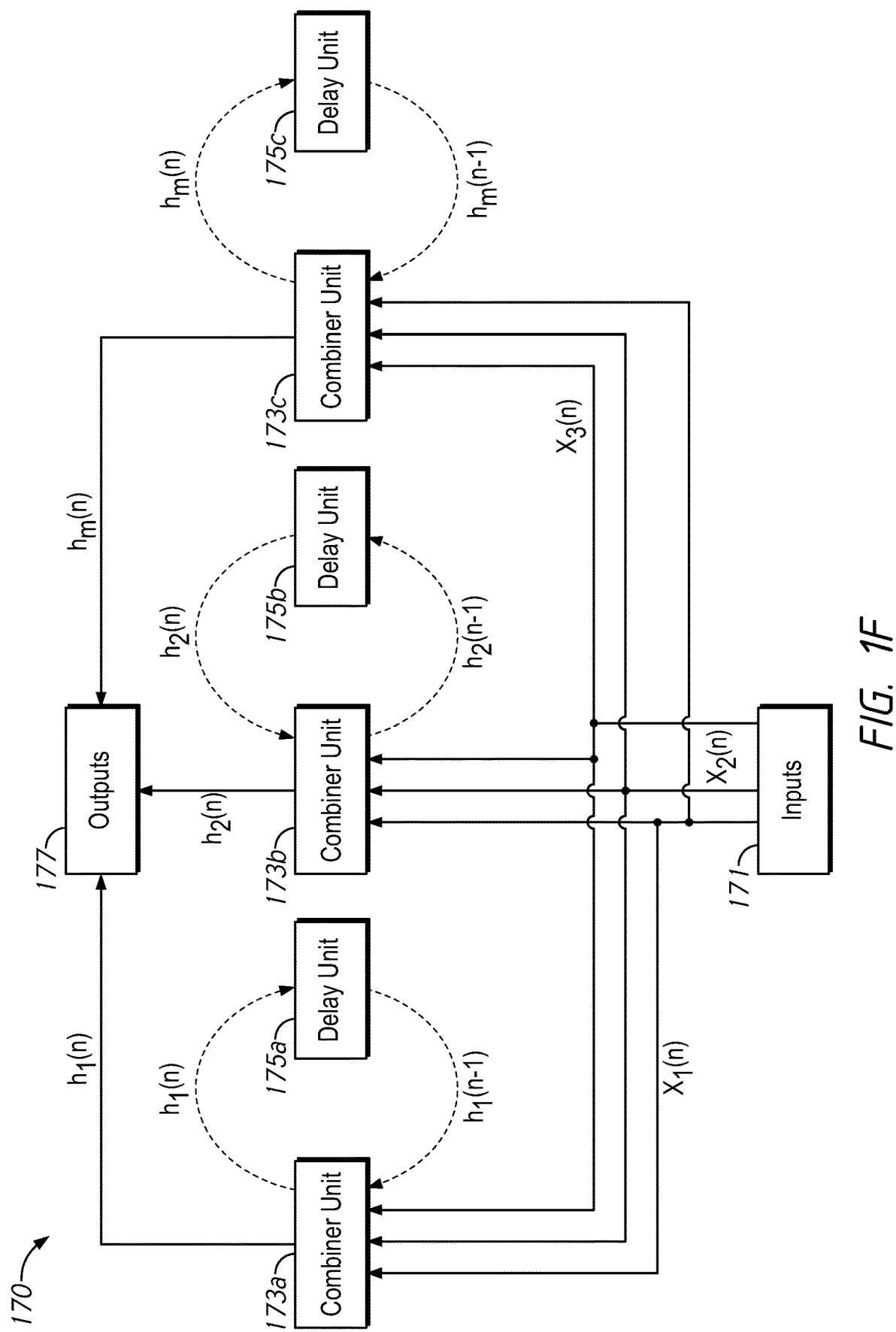
FIG. 1F is a schematic illustration of a recurrent neural network arranged in accordance with examples described herein.

FIG. 1F is a schematic illustration of a recurrent neural network arranged in accordance with examples described herein. The neural network 170 include three stages (e.g., layers): an inputs node 171; a combiner stage 173 and 175, and an outputs node 177. While three stages are shown in FIG. 1F, any number of stages may be used in other examples, e.g., as described with reference to FIGS. 2A-2C. Details of example implementations of neural network 170, in the context of FIGS. 2A-2C, will be presented in the description of FIGS. 2A-2C. In some implementations, the neural network 170 may have multiple combiner stages such that outputs from one combiner stage is provided to another combiners stage, until being providing to an outputs node 177. As described with reference to FIG. 2A, for example, there may be multiple combiner stages in a neural network 170. As depicted in FIG. 1F, the delay units 175a, 175b, and 175c may be optional components of the neural network 170. When such delay units 175a, 175b, and 175c are utilized as described herein, the neural network 170 may be referred to as a recurrent neural network.

The first stage of the neural network 170 includes inputs node 171. The inputs node 171 may receive input data at various inputs of the recurrent neural network. In some examples, the inputs node 171 may include multiple input nodes, such as input node 168, node 169, node 172, and node 174 of FIG. 1F. The second stage of the neural network 170 is a combiner stage including combiner units 173a, 173b, 173c; and delay units 175a, 175b, 175c. Accordingly, the combiner units 173 and delay units 175 may be collectively referred to as a stage of combiners. In some implementations, the combiner units 173a, 173b, and 173c may corresponds to combiner 152, combiner 154, and combiner 156 of FIG. 1E, for example. Accordingly, as described with respect to FIG. 1D with processing circuitry 112 implementing such combiners, generally processing circuitry 112 that implements the combiner units 173a-c and delay units 175a-c in the second stage may perform a nonlinear activation function using the input data from the inputs node 171 (e.g., input signals $X_1(n)$, $X_2(n)$, and $X_3(n)$). The third stage of neural network 170 includes the outputs node 177. In some examples, the outputs node 177 may include combiner 160, combiner 162, and combiner 164 of FIG. 1E. Accordingly, in some examples, the outputs nodes 177 may be referred to as a stage of combiners. Additional, fewer, and/or different components may be used in other examples.

The recurrent neural network 170 includes delay units 175a, 175b, and 175c, which generate delayed versions of the output from the respective combiner units 173a-c based on receiving such output data from the respective combiner units 173a-c. In the example, the output data of combiner units 173a-c may be represented as h(n); and, accordingly, each of the delay units 175a-c delay the output data of the combiner units 173a-c to generate delayed versions of the output data from the combiner units 173a-c, which may be represented as h(n–t). In various implementations, the amount of the delay, t, may also vary, e.g., one clock cycle, two clock cycles, or one hundred clock cycles. That is, the delay unit 175 may receive a clock signal and utilize the clock signal to identify the amount of the delay. In the example of FIG. 1F, the delayed versions are delayed by one time period, where '1' represents a time period. A time period may correspond to any number of units of time, such as a time period defined by a clock signal or a time period defined by another element of the neural network 170.

Continuing in the example of FIG. 1F, each delay unit 175a-c provides the delayed versions of the output data from the combiner units 173a-c as input to the combiner units 173a-c, to operate, optionally, as a recurrent neural network. Such delay units 175a-c may provide respective delayed versions of the output data from nodes of the combiner units 173a-c to respective input units/nodes of the combiner units 173a-c. In utilizing delayed versions of output data from combiner units 173a-c, the recurrent neural network 170 may train weights at the combiner units 173a-c that incorporate time-varying aspects of input data to be processed by such a recurrent neural network 170. Once trained, in some examples, the inputs node 171 receives input encoded data that is to be processed in the recurrent neural network 170. For example, each stream of input data may correspond to a different obtained set of encoded data that is representative of a temporal signal. Because an RNN 170 incorporates the delayed versions of output data from combiner units 173a-c, the delayed versions of output data from the combiner units 173a-c provide feedback information representative of the temporal nature, with the RNN 170 providing output decoded faster with the RNN 170 incorporating that temporal nature into calculating the output decoded data. In the example, the output decoded data may be representative of an estimate of message probability compute data based on input encoded data that was encoded according to the associated encoding technique.

Generally, a recurrent neural network may include multiple stages of nodes. The nodes may be implemented using processing circuitry 112 which may execute one or more functions on inputs received from a previous stage and provide the output of the functions to the next stage of the recurrent neural network. The processing units may be implemented using, for example, one or more processors, controllers, and/or custom circuitry, such as an application specific integrated circuit (ASIC) and/or a field programmable gate array (FPGA). In some examples, the processing units may be implemented using any of the processing circuitry 112 described with respect to FIGS. 2A-2C. The processing units may be implemented as combiners and/or summers and/or any other structure for performing functions allocated to the processing unit. In some examples, certain of the elements of neural networks described herein perform weighted sums, e.g., may be implemented using one or more multiplication/accumulation units, which may be implemented using processor(s) and/or other circuitry. In an example, the neural network 170 may be implemented by the electronic device 110 utilizing any combination of one or more processing units described with respect to FIGS. 2A-2C.

Examples of recurrent neural network training and inference can be described mathematically. Again, as an example, consider input data at a time instant (n), given as: $X(n)=[x_1(n), x_2(n), \ldots x_N(n)]^T$. The center vector for each element in hidden layer(s) of the recurrent neural network 170 (e.g., combiner units 173 including combiner 152, combiner 154, combiner 156, and combiner 158 of FIG. 1E) may be denoted as $C_i$ (for i=1, 2, . . . , H, where H is the element number in the hidden layer).

The output of each element in a hidden layer may then be given as:

$$h_i(n)=f_i(\|X(n)+h_i(n-t)-C_i\|) \text{ for } (i=1,2, \ldots, H) \quad (9)$$

i may be the delay at the delay unit 175 such that the output of the combiner units 173 includes a delayed version of the output of the combiner units 173. In some examples, this may be referred to as feedback of the combiner units 173. Accordingly, each of the connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$mp_i(n) = \sum_{j=1}^{H} W_{ij}h_j(n) + W_{ij}h_j(n-t) \quad (10)$$
$$= \sum_{j=1}^{H} W_{ij}f_j(\|X(n)+h_i(n-t)-C_j\|)$$

for (i=1, 2, . . . , L) and where L is the element number of the output of the output layer and $W_{ij}$ is the connection weight between the j'th element in the hidden layer and the i'th element in the output layer.

Additionally or alternatively, while FIG. 1F has been described with respect to a single stage of combiners (e.g., second stage) including the combiner units 173a-c and delay units 175a-c, it can be appreciated that multiple stages of similar combiner stages may be included in the neural network 170 with varying types of combiner units and varying types of delay units with varying delays, for example, as will now be described with reference to FIGS. 2A-2C. Further, the same neural network (e.g., the neural network 170 of FIG. 1F) can be used to facilitate decoding of encoded data from any of multiple error correction encoder by selecting different weights that were obtained by the training for the particular error correction technique employed. In the example, different weights may correspond to particular weights used to estimate message probability compute data based on encoded data of a particular error correction technique employed. In this manner, recurrent neural networks may serve as a MPC (e.g., NN MPC 52) for multiple encoder types, like the neural network 150. In an example implementation, the recurrent neural network 170 may be used to implement the NN MPC 52. Advantageously, the recurrent neural network 170 utilizes delayed versions of output data from combiner units 173a-c, to provide feedback information representative of a temporal nature. As such, the RNN 170 may provide output data decoded faster with the RNN 170, e.g., as compared to the neural network 150. For example, if a particular encoding technique is susceptible to noise during storing in a memory 140 or memory 145 (e.g., bit flips), obtained encoded data to be decoded by the RNN 170 may include noise that produces a time-varying effect on the obtained encoded data (e.g., temporal nature). Accordingly, the feedback information included in the delayed versions of output data may improve the efficiency of the RNN 170 (e.g., as compared to a neural network 150), to decode encoded data, e.g., in using an estimate of message probability compute data based on encoded data that is associated with an iterative decoding technique complementary to the encoding technique.

Figure 2A:
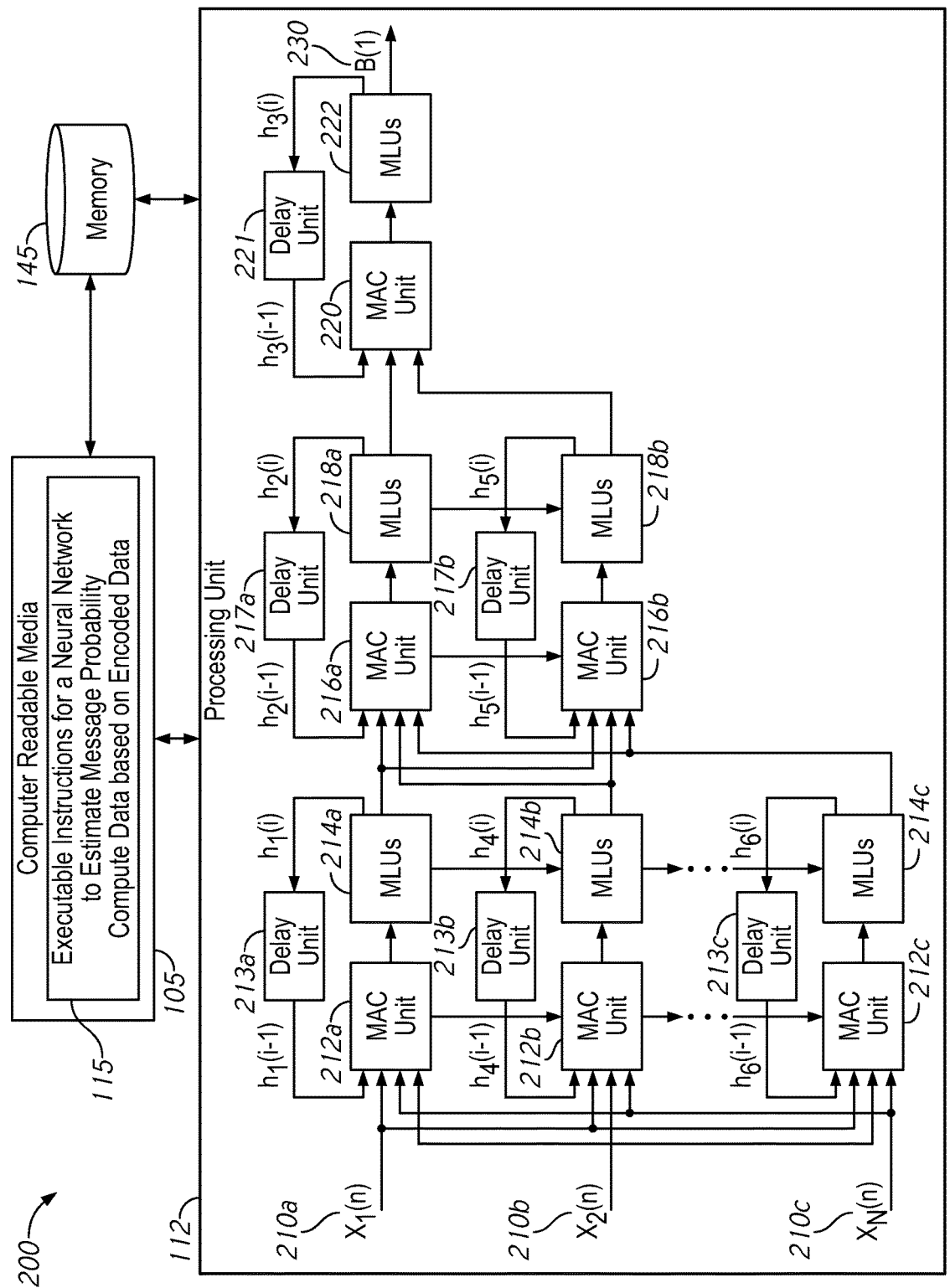
FIGS. 2A-2C are schematic illustrations of processing circuitry arranged in systems in accordance with examples described herein.

FIG. 2A is a schematic illustration of processing circuitry 112 arranged in a system 200 in accordance with examples described herein. Such a hardware implementation (e.g., system 200) may be used, for example, to implement one or more neural networks, such as NN MPC 52 of FIG. 1C, the neural network 150 of FIG. 1E, or the recurrent neural network 170 of FIG. 1F. Additionally or alternatively, in some implementations, the processing circuitry 112 may receive input data 210a, 210b, and 210c from such a computing system. The input data 210a, 210b, and 210c may be encoded data obtained from a sensor or data stored in the memory 145. Accordingly, the input data obtained may be N bits of noisy encoded input data that is provided to an input stage (e.g., an input layer) of the processing unit, with the input data 210a $X_1(i)$ corresponding to the first bit; the input data 210b $X_2(i)$ corresponding to the second bit; and the input data 210c $X_{iN}(i)$ corresponding to the N'th bit. In some examples, the obtained input data may be data encoded in accordance with an encoding technique (e.g., low density parity check coding (LDPC), Reed-Solomon coding, Bose-Chaudhuri-Hocquenghem (BCH), and/or Polar coding).

Processing circuitry 112 may implement a message probability compute functionality or an estimating operation for the received encoded input data at an electronic device 110 so as to output an estimate of message probability compute data (e.g., B(1) 230). In various implementations, processing circuitry 112 may implement a neural network message probability computing component of an MPC decoder, such as NN MPC 52 of MPC decoder 50 depicted in FIG. 1C. Accordingly, processing circuitry 112 of FIG. 2A, implementing a NN MPC 5, may be referred to as a recurrent neural network.

In the example implementation, the processing circuitry 112 are configured to receive encoded data that uses an encoding technique associated with an iterative decoding and to generate generates an estimate of the message probability compute data set (mp1, mp2, . . . mpL). Advantageously, the estimate of the message probability compute data set is equivalent to output after processing of multiple iterations (e.g., k iterations) by a feedback error path associated with message probability compute circuitry in an iterative decoder. Accordingly, the processing circuitry 112 may facilitate the decoding of encoded data that is associated with a particular encoding technique, as if the encoded data was iteratively decoded.

Additionally or alternatively, in some implementations, the input data may be noisy due to noise experienced during storing of the encoded data in the memory 140 or memory 145 (e.g., bit flips). For example, encoded data stored in the memory 140 or memory 145 may be obtained as input data to be provided to the electronic device 110 in which the processing circuitry 112 is implemented.

The processing circuitry 112 may include multiplication unit/accumulation (MAC) units 212a-c, 216a-b, and 220; delay units 213a-c, 217a-b, and 221, and memory lookup units (MLUs) 214a-c, 218a-b, and 222 that, when mixed with input data obtained from the memory 145, may generate output data (e.g. B(1)) 230. Each set of MAC units and MLU units having different element numbers may be referred to as a respective stage of combiners for the processing circuitry 112. For example, a first stage of combiners includes MAC units 212a-c and MLUs 214a-c, operating in conjunction with delay units 213a-c, to form a first stage or "layer," as referenced with respect to FIG. 1E having "hidden" layers as various combiner stages. Continuing in the example, the second stage of combiners includes MAC units 216a-b and MLUs 218a-b, operating in conjunction with delay units 217a-b, to form a second stage or second layer of hidden layers. And the third stage of combiners may be a single combiner including the MAC unit 220 and MLU 222, operating in conjunction with delay unit 221, to form a third stage or third layer of hidden layers.

In context of neural network 150 of FIG. 1E for example, the first stage of combiners of processing circuitry 112—including MAC units 212a-c and MLUs 214a-c operating in conjunction with delay units 213a-c—can correspond to combiner 152, combiner 154, combiner 156, and combiner 158, which is the second stage of neural network 150. Continuing in example, as described with respect to the neural network 150, it may include additional stages or hidden layers in various embodiments, such that the combiner 160, combiner 162, combiner 164, or combiner 166 corresponds to the single combiner of FIG. 2A, including the MAC unit 220 and MLU 222. Similarly, in an example within the context of recurrent network 170 of FIG. 1F, the first stage of combiners of processing circuitry 112—including MAC units 212a-c operating in conjunction with delay units 213a-c—can correspond to the combiner stage of recurrent neural network 170 including combiner units 173a, 173b, 173c; and delay units 175a, 175b, 175c.

In an example of input data being processed into message probability computing data, the output data 230 B(1) may be an estimate of message probability compute data based on the encoded input data in some examples. In operation, the processing circuitry 112, may implement executable instructions 115 for a neural network to estimate message probability compute data based on encoded data, stored at the computer readable media 105, to cause the processing circuitry 112 to configure the multiplication units 212a-c, 216a-c, and 220 to multiply and/or accumulate input data 210a, 210b, and 210c and delayed versions of processing results from the delay units 213a-c, 217a-b, and 221 (e.g., respective outputs of the respective layers of MAC units) with coefficient data to generate the output data 230 B(1). For example, the executable instructions 115 may cause the memory 145 to provide weights and/or other parameters stored in the memory 145, which may be associated with a certain encoding technique, to the MLUs 214a-c, 218a-b, and 222 as weights for the MAC units 212a-c, 216a-c, and 220 and delay units 213a-c, 217a-b, and 221. Accordingly, during operation, the processing circuitry 112 may implement the executable instructions 115 to select certain coefficient data (e.g., a plurality of coefficients) as weights from memory 145 based on an indicated encoding technique of the received encoded data.

In an example of executing such instructions 115 for a neural network to estimate message probability compute data, the instructions 115 may include mixing encoded input data with a plurality of coefficients or weights (e.g., stored as weights 118 in computer readable media 105), at a first layer of the MAC units 212a-c and MLUs 214a-c, the multiplication unit/accumulation units 212a-c are configured to multiply and accumulate at least two operands from corresponding input data 210a, 210b, or 210c and an operand from a respective delay unit 213a-c to generate a multiplication processing result that is provided to the MLUs 214a-c. For example, the multiplication unit/accumulation units 212a-c may perform a multiply-accumulate operation such that three operands, M N, and T are multiplied and then added with P to generate a new version of P that is stored in its respective MLU 214a-c. Accordingly, the MLU 214a latches the multiplication processing result, until such time that the stored multiplication processing result is be provided to a next layer of MAC units. The MLUs 214a-c, 218a-b, and 222 may be implemented by any number of processing elements that operate as a memory look-up unit such as a D, T, SR, and/or JK latches.

The MLUs 214a-c, 218a-b, and 222 shown in FIG. 2A may generally perform a predetermined nonlinear mapping from input to output. For example, the MLUs 214a-c, 218a-b, and 222 may be used to evaluate at least one non-linear function. In some examples, the contents and size of the various MLUs 214a-c, 218a-b, and 222 depicted may be different and may be predetermined. In some examples, one or more of the MLUs 214a-c, 218a-b, and 222 shown in FIG. 2A may be replaced by a single consolidated MLU (e.g., a table look-up). Examples of nonlinear mappings (e.g., functions) which may be performed by the MLUs 214a-c, 218a-b, and 222 include Gaussian functions, piecewise linear functions, sigmoid functions, thin-plate-spline functions, multiquadratic functions, cubic approximations, and inverse multi-quadratic functions. Examples of functions have been described with reference also to FIG. 1E. In some examples, selected MLUs 214a-c, 218a-b, and 222 may be by-passed and/or may be de-activated, which may allow an MLU and its associated MAC unit to be considered a unity gain element.

Additionally in the example, the MLU 214a provides the processing result to the delay unit 213a. The delay unit 213a delays the processing result (e.g., $h_1(i)$) to generate a delayed version of the processing result (e.g., $h_1(i-1)$) to output to the MAC unit 212a as operand T. While the delay units 213a-c, 217a-b, and 221 of FIG. 2A are depicted introducing a delay of '1', it can be appreciated that varying amounts of delay may be introduced to the outputs of first layer of MAC units. For example, a clock signal that introduced a sample delay of '1' (e.g., $h_1(i-1)$) may instead introduce a sample delay of ' 2', '4', or '100'. In various implementations, the delay units 213a-c, 217a-b, and 221 may correspond to any number of processing units that can introduce a delay into processing circuitry using a clock signal or other time-oriented signal, such as flops (e.g., D-flops) and/or one or more various logic gates (e.g., AND, OR, NOR, etc. . . . ) that may operate as a delay unit.

In the example of a first hidden layer of a recurrent neural network, the MLUs 214a-c may retrieve coefficient data stored in the memory 145, which may be weights associated with weights to be applied to the first layer of MAC units to both the data from the current period and data from a previous period (e.g., the delayed versions of first layer processing results). For example, the MLU 214a can be a table look-up that retrieves one or more coefficients to be applied to both operands M and N, as well as an additional coefficient to be applied to operand T. The MLUs 214a-c also provide the generated multiplication processing results to the next layer of the MAC units 216a-b and MLUs 218a-b. The additional layers of the MAC units 216a, 216b and MAC unit 220 working in conjunction with the MLUs 218a, 218b and MLU 222, respectively, may continue to process the multiplication results to generate the output data 230 B(1). Using such a circuitry arrangement, the output data 230 B(1) may be generated from the input data 210a, 210b, and 210c.

Figure 2B:
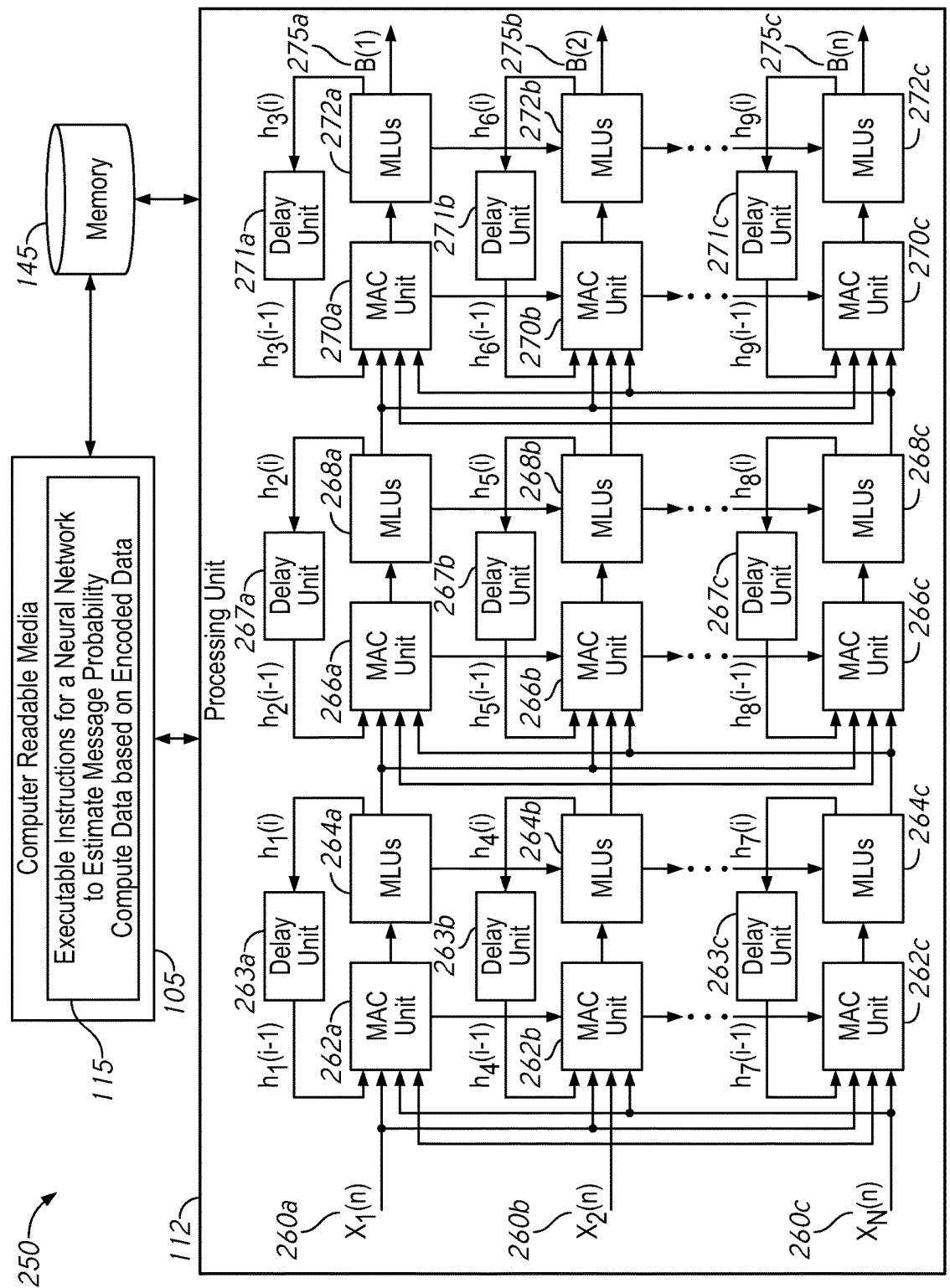

Advantageously, the processing circuitry 112 of system 200 may utilize a reduced number of MAC units and/or MLUs, e.g., as compared to the processing circuitry 112 of FIG. 2B. Each subsequent layer may have a reduced portion of MAC units, delay units, and MLUs. As depicted, in FIG. 2A for example, a second layer of MAC units 216a-b, delay unit 217a-b, and MLUs 218a-b may include m−1 MAC units and MLUs, when m=3. Accordingly, the last layer in the processing circuitry 112, including the MAC unit 220, delay unit 221, and MLU 222, includes only one MAC, one delay unit, and one MLU.

The plurality of coefficients, for example from memory 145, can be mixed with the input data 210a-210c and delayed version of processing results to generate the output data 230 B(1). For example, the relationship of the plurality of coefficients to the output data 230 B(1) based on the input data 210a-c and the delayed versions of processing results may be expressed as:

$$B(1) = a^1 * f(\Sigma_{j=1}^{m-1} a^{(m-1)} f_j(\Sigma_{k=1}^{m} a^{(m)} X_k(i))) \qquad (11)$$

where $d^{(m)}$, $d^{(m-1)}$, $a^1$ are coefficients for the first layer of multiplication/accumulation units 212a-c and outputs of delay units 213a-c; the second layer of multiplication/accumulation units 216a-b and outputs of delay units 217a-b; and last layer with the multiplication/accumulation unit 220 and output of delay unit 221, respectively; and where f(•) is the mapping relationship which may be performed by the memory look-up units 214a-c and 218a-b. As described above, the memory look-up units 214a-c and 218a-b retrieve coefficients to mix with the input data and respective delayed versions of each layer of MAC units. Accordingly, the output data may be provided by manipulating the input data and delayed versions of the MAC units with the respective multiplication/accumulation units using one or more pluralities of coefficients stored in the memory. The pluralities of coefficients may be specific to an iterative decoding technique associated with the encoded data. The resulting mapped data may be manipulated by additional multiplication/accumulation units and additional delay units using additional sets of coefficients stored in the memory associated with the desired encoding technique. Accordingly, pluralities of coefficients multiplied at each stage of the processing circuitry 112 may represent or provide an estimation of the processing of the input data in specifically-designed hardware (e.g., an FPGA).

Each of the multiplication unit/accumulation units 212a-c, 216a-b, and 220 may include multiple multipliers, multiple accumulation unit, or and/or multiple adders. Any one of the multiplication unit/accumulation units 212a-c, 216a-b, and 220 may be implemented using an ALU. In some examples, any one of the multiplication unit/accumulation units 212a-c, 216a-b, and 220 can include one multiplier and one adder that each perform, respectively, multiple multi-plications and multiple additions. The input-output relationship of a multiplication/accumulation unit 212a-c, 216a-b, and 220 may be represented as:

$$B_{out} = \sum_{i=1}^{I} C_i * B_{in}(i) \qquad (12)$$

where "I" represents a number to perform the multiplications in that unit, $C_i$ the coefficients which may be accessed from a memory, such as memory 145, and $B_{in}(i)$ represents a factor from either the input data 210a-c or an output from multiplication unit/accumulation units 212a-c, 216a-b, and 220. In an example, the output of a set of multiplication unit/accumulation units, $B_{out}$, equals the sum of coefficient data, $C_i$ multiplied by the output of another set of multiplication unit/accumulation units, $B_{in}(i)$. $B_{in}(i)$ may also be the input data such that the output of a set of multiplication unit/accumulation units, $B_{out}$, equals the sum of coefficient data, $C_i$ multiplied by input data.

While described in FIG. 2A as processing circuitry 112 implementing a NN MPC 52 as a recurrent neural network, it can be appreciated that processing circuitry 112, described herein, may estimate message probability compute data based on encoded data, e.g., as implemented in any recurrent neural network or to perform any MPC functionality of an MPC decoder.

FIG. 2B is a schematic illustration of a processing circuitry 112 arranged in a system 250 in accordance with examples described herein. Such a hardware implementation (e.g., system 250) may be used, for example, to implement one or more neural networks, such as NN MPC 52 of FIG. 1C, the neural network 150 of FIG. 1E, or the recurrent neural network 170 of FIG. 1F. Processing circuitry 112 may implement a message probability compute functionality or an estimating operation for the received encoded input data at an electronic device 110 so as to output an estimate of message probability compute data (e.g., B(1) 275a, B(2) 275b . . . . B(n) 275c). In various implementations, processing circuitry 112 may implement a neural network message probability computing component of an MPC decoder, such as NN MPC 52 of MPC decoder 50 depicted in FIG. 1C. Accordingly, processing circuitry 112 of FIG. 2B, implementing a NN MPC 52, may be referred to as a recurrent neural network.

Additionally or alternatively, in some implementations, the processing circuitry 112 may receive input data 210a, 210b, and 210c from a computing system. Similarly described elements of FIG. 2B may operate as described with respect to FIG. 2A, but may also include additional features as described with respect to FIG. 2B. For example, FIG. 2B depicts MAC units 262a-c and delay units 263a-c that may operate as described with respect MAC units 212a-c and delay units 213a-c of FIG. 2A. Accordingly, elements of FIG. 2B, whose numerical indicator is offset by 50 with respect to FIG. 2A, include similarly elements of the processing circuitry 112; e.g., MAC unit 266a operates similarly with respect to MAC unit 216a. The system 250, including processing circuitry 112, also includes additional features not highlighted in the processing circuitry 112 of FIG. 2A. For example, the processing circuitry 112 of FIG. 2B additionally includes MAC units 266c and 270b-c; delay units 267c and 271b-c; and MLUs 268c and 272b-c, such that the output data is provided as 275a-c, rather than as singularly in FIG. 2A as B(1) 230. Advantageously, the system 250 including a processing circuitry 112 may process the input data 260a-c to generate the output data 275a-c with greater precision. For example, the output data 275a-c may process the input data 260a-260c with additional coefficient retrieved at MLU 268c and multiplied and/or accumulated by additional MAC units 266c and 270b-c and additional delay units 267c and 271b-c. For example, such additional processing may result in output data that is more precise with respect providing output data that is an estimate of decoded data (e.g., as compared to output data obtained from the processing circuitry 112 of FIG. 2A). In implementations where board space (e.g., a printed circuit board) is not a primary factor in design, implementations of the processing circuitry 112 of FIG. 2B may be desirable as compared to that of processing circuitry 112 of FIG. 2A; which, in some implementations may occupy less board space as a result of having fewer elements than the processing circuitry 112 of FIG. 2B.

While processing circuitry 112 is described in the context of FIGS. 2A and 2B as a single processing circuitry 112, the features may also be implemented in the processing circuitry 112 of FIG. 1D, such that the description of the single processing circuitry 112 in FIG. 2A or 2B is interchangeable as a processing element as implemented throughout the examples described herein. Therefore, it can be appreciated that, while referring to a single processing circuitry 112 in FIG. 2A or 2B, the electronic device 110 may have multiple processing circuitry 112, like FIG. 1D, to also have the same features as described with respect a single processing circuitry 112 of FIG. 2A or 2B.

In context of neural network 150 of FIG. 1E for example, the first stage of combiners of processing circuitry 112—including MAC units 262a-c and MLUs 264a-c operating in conjunction with delay units 263a-c—can correspond to combiner 152, combiner 154, combiner 156, and combiner 158, which is the second stage of neural network 150. Continuing in example, as described with respect to the neural network 150, it may include additional stages or hidden layers in various embodiments, such that the combiner 160, combiner 162, combiner 164, or combiner 166 correspond to the MAC units 270a-c and MLUs 272a-c operating in conjunction with delay units 271a-c. Similarly, in an example within the context of recurrent network 170 of FIG. 1F, the first stage of combiners of processing circuitry 112—including MAC units 262a-c operating in conjunction with delay units 263a-c—can correspond to the combiner stage of recurrent neural network 170 including combiner units 173a, 173b, 173c; and delay units 175a, 175b, 175c.

Figure 2C:
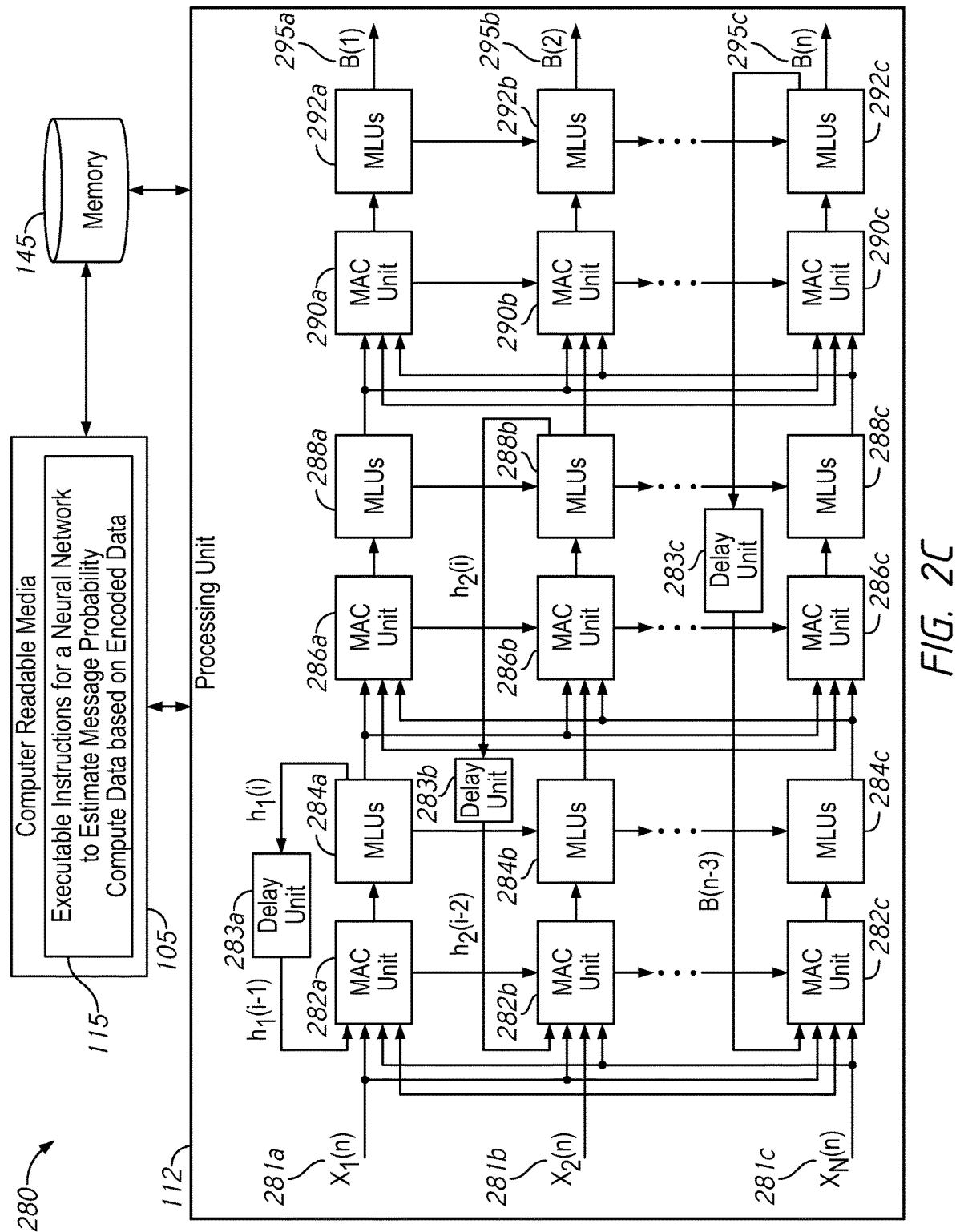

FIG. 2C is a schematic illustration of a processing circuitry 112 arranged in a system 280 in accordance with examples described herein. Such a hardware implementation (e.g., system 280) may be used, for example, to implement one or more neural networks, such as NN MPC 52 of FIG. 1C, the neural network 150 of FIG. 1E, or the recurrent neural network 170 of FIG. 1F. Processing circuitry 112 may implement a message probability compute functionality or an estimating operation for the received encoded input data at an electronic device 110 so as to output an estimate of message probability compute data (e.g., B(1) 295a, B(2) 295b . . . . B(n) 295c). In various implementations, processing circuitry 112 may implement a neural network message probability computing component of an MPC decoder, such as NN MPC 52 of MPC decoder 50 depicted in FIG. 1C. Accordingly, processing circuitry 112 of FIG. 2C, implementing a NN MPC 52, may be referred to as a recurrent neural network.

Additionally or alternatively, in some implementations, he processor circuitry 112 may be implemented as a processing circuitry 112 in the example of FIG. 1D. Similarly described elements of FIG. 2C may operate as described with respect to FIG. 2B, except for the delay units 263a-c, 267a-c, and 271a-c of FIG. 2B. For example, FIG. 2C depicts MAC units 282a-c and delay units 283a-c that may operate as described with respect to MAC units 262a-c and delay units 263a-c of FIG. 2B. Accordingly, elements of FIG. 2C, whose numerical indicator is offset by 20 with respect to FIG. 2B, include similarly elements of the processing circuitry 112; e.g., MAC unit 286a operates similarly with respect to MAC unit 266a.

The system 280, including processing circuitry 112, also includes additional features not highlighted in the processing circuitry 112 of FIG. 2B. Different than FIG. 2B, FIG. 2C depicts delay units 283a, 283b, and 283c. Accordingly, the processing unit of FIG. 2C illustrate that processing circuitry 112 may include varying arrangements to the placement of the inputs and outputs of delay units, as illustrated with delay units 283a, 283b, and 283c. For example, the output of MLUs 288b may be provided to delay unit 283b, to generate a delayed version of that processing result from the second layer of MAC units, as an input to the first layer of MAC units, e.g., as an input to MAC unit 282b. Accordingly, the processing circuitry 112 of system 280 is illustrative that delayed versions of processing results may be provided as inputs to other hidden layers, different than the processing circuitry 112 of system 250 in FIG. 2B showing respective delayed versions being provided as inputs to the same layer in which those delayed versions were generated (e.g., the output of MLU 268b is provided to delay unit 267b, to generate a delayed version for the MAC unit 266b in the same layer from which the processing result was outputted). Therefore, in the example, even the output B(n) 295c may be provided, from the last hidden layer, to the first hidden layer (e.g., as an input to MAC unit 282c).

Advantageously, such delayed versions of processing results, which may be provided as inputs to different or additional hidden layers, may better compensate "higher-order" memory effects in a recurrent neural network 170 that implements processing circuitry 112 of FIG. 2C, e.g., as compared to the processing circuitry 112 of FIG. 2A or 2B. For example, higher-order memory effects model the effects of leading and lagging envelope signals used during training of the recurrent neural network 170, to transform obtained noisy encoded input data at the processing circuitry 112 into an estimate of message probability compute data). The obtained encoded input data, in being stored in a memory 140 or memory 145 with noise (e.g., bit flips) or other noises experienced during storage (e.g., shot or voltage noise) may be noisy encoded input data to be decoded, e.g., in part by the recurrent neural network 170 providing an estimate of message probability compute data. In the example, a recurrent neural network 170 that estimates the output data may include varying delayed versions of processing results that corresponds to such leading and lagging envelopes (e.g., of various envelopes encapsulating the noise(s)). Accordingly, implementing the processing circuitry 112 incorporates such higher-order memory effects, e.g., for an inference of a recurrent neural network 170, to provide message probability compute data as output data 295a-c based on input data 281a-c.

While processing circuitry 112 is described in the context of FIGS. 2A, 2B, and 2C as a single processing circuitry 112, the features may also be implemented in the processing circuitry 112 of FIG. 1D, such that the description of the single processing circuitry 112 in FIG. 2A, 2B, 2C is interchangeable in any processing circuitry, as implemented throughout the examples described herein. Therefore, it can be appreciated that, while referring to a single processing circuitry 112 in FIGS. 2A, 2B, 2C the electronic device 110 may have multiple processing circuitry 112, like FIG. 1D, to also have the same features as described with respect a single processing circuitry 112 of FIG. 2A, 2B, or 2C.

While described in FIGS. 2A, 2B and 2C as processing circuitry 112 implementing a NN MPC 52 as a recurrent neural network, it can be appreciated that processing circuitry 112, described herein, may estimate message probability compute data based on encoded data, e.g., as implemented in any recurrent neural network or to perform any MPC functionality of an MPC decoder. In the example implementations, multiple processing circuitry 112 (e.g., one or more of any of the processing circuitry 112 depicted in FIGS. 2A-2C) are configured to receive encoded data that uses an encoding technique associated with an iterative decoding and to generate generates an estimate of the message probability compute data set (mp1, mp2, . . . mpL). Advantageously, the estimate of the message probability compute data set is equivalent to output after processing of multiple iterations (e.g., k iterations) by a feedback error path associated with message probability compute circuitry in an iterative decoder. Accordingly, the processing circuitry 112 may facilitate the decoding of encoded data that is associated with a particular encoding technique, as if the encoded data was iteratively decoded.

Figure 3:
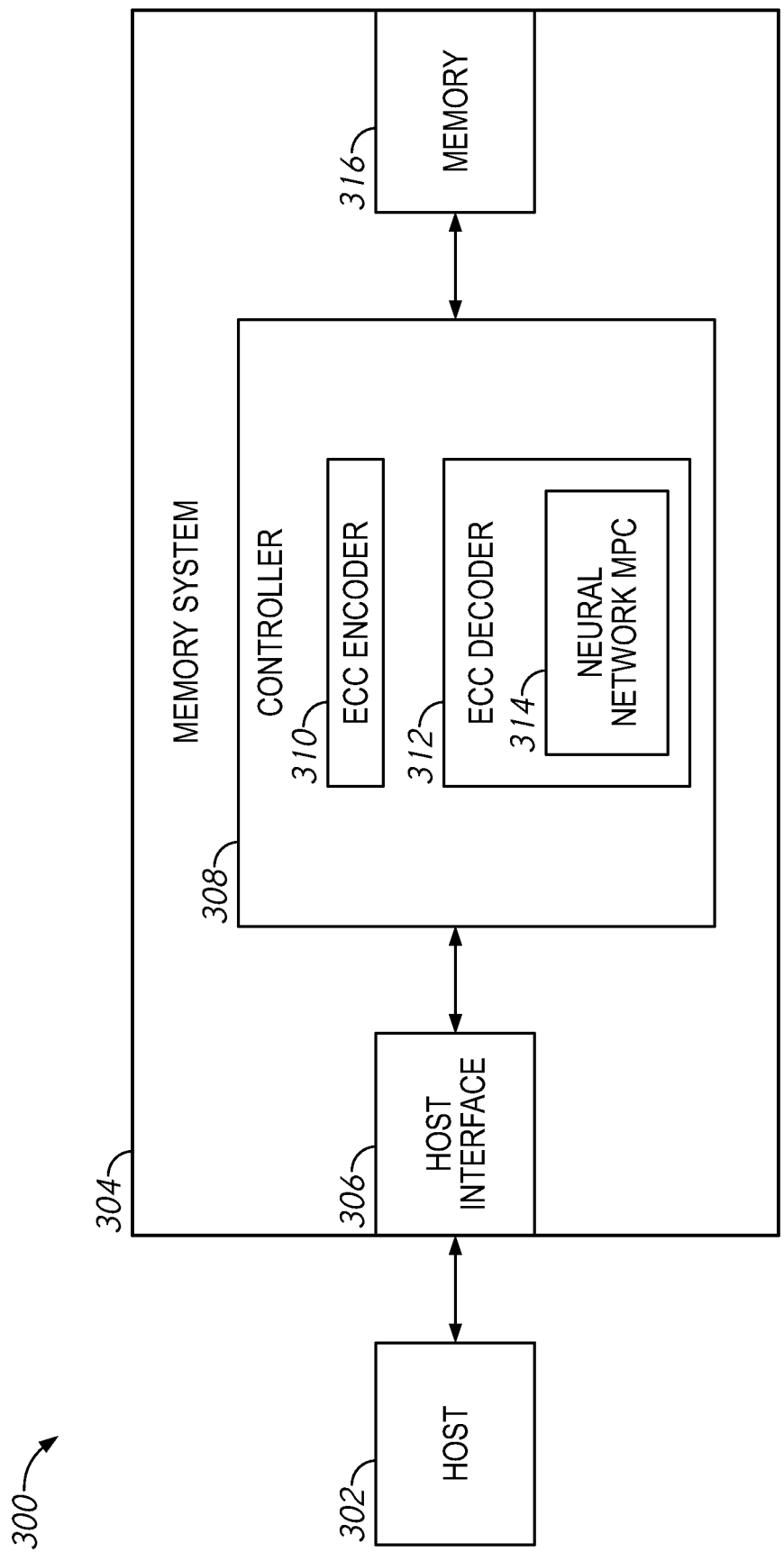
FIG. 3 is a schematic illustration of an apparatus arranged in accordance with examples described herein.

FIG. 3 is a schematic illustration of apparatus 300 (e.g., an integrated circuit, a memory device, a memory system, an electronic device or system, a smart phone, a tablet, a computer, a server, an appliance, a vehicle, etc.) according to an embodiment of the disclosure. The apparatus 300 may generally include a host 302 and a memory system 304.

The host 302 may be a host system such as a personal laptop computer, a desktop computer, a digital camera, a mobile telephone, or a memory card reader, among various other types of hosts. The host 302 may include a number of memory access devices (e.g., a number of processors). The host 302 may also be a memory controller, such as where memory system 304 is a memory device (e.g., a memory device having an on-die controller).

The memory system 304 may be a solid state drive (SSD) or other type of memory and may include a host interface 306, a controller 308 (e.g., a processor and/or other control circuitry), and a number of memory device 316. The memory system 304, the controller 308, and/or the memory device 316 may also be separately considered an "apparatus." The memory device 316 may include a number of solid state memory devices such as NAND flash devices, which may provide a storage volume for the memory system 304. Other types of memory may also be used.

The controller 308 may be coupled to the host interface 306 and to the memory device 316 via a plurality of channels to transfer data between the memory system 304 and the host 302. The interface 306 may be in the form of a standardized interface. For example, when the memory system 304 is used for data storage in the apparatus 300, the interface 306 may be a serial advanced technology attachment (SATA), peripheral component interconnect express (PCIe), or a universal serial bus (USB), among other connectors and interfaces. In general, interface 306 provides an interface for passing control, address, data, and other signals between the memory system 304 and the host 302 having compatible receptors for the interface 306.

The controller 308 may communicate with the memory device 316 (which in some embodiments can include a number of memory arrays on a single die) to control data read, write, and erase operations, among other operations. The controller 308 may include a discrete memory channel controller for each channel (not shown in FIG. 3) coupling the controller 308 to the memory device 316. The controller 308 may include a number of components in the form of hardware and/or firmware (e.g., one or more integrated circuits) and/or software for controlling access to the memory device 316 and/or for facilitating data transfer between the host 302 and memory device 316.

The controller 308 may include an ECC encoder 310 for encoding data bits written to the memory device 316 using one or more encoding techniques. The ECC encoder 310 may include a single parity check (SPC) encoder, and/or an algebraic error correction circuit such as one of the group including a Bose-Chaudhuri-Hocquenghem (BCH) ECC encoder and/or a Reed Solomon ECC encoder, among other types of error correction circuits. The controller 308 may further include an ECC decoder 312 for decoding encoded data, which may include identifying erroneous cells, converting erroneous cells to erasures, and/or correcting the erasures. The memory device 316 may, for example, include one or more output buffers which may read selected data from memory cells of the memory device 316. The output buffers may provide output data, which may be provided as encoded input data to the ECC decoder 312. In various embodiments, the ECC decoder 312 may be capable of decoding data for each type of encoder in the ECC encoder 310. The ECC decoder 312 may be an MPC decoder such as MPC decoder 30 or MPC decoder 50. Accordingly, the ECC decoder 312 may include a neural network MPC 314 that operates as NN MPC 52 for an MPC decoder 50.

The neural network 150 of FIG. 1E and/or neural network 170 of FIG. 1F (e.g., as implemented by one or more processing units of FIGS. 2A-2C) may be used to implement the neural network MPC 314 of FIG. 3, for example. For example, the memory 145 of FIG. 2A, 2B, or 2C may store pluralities of coefficients specific to various iterative decoding technique associated with one or more types encoded data that may encoded by the ECC encoder 310. Accordingly, a hardware implementation of neural network 150 or recurrent neural network 170 may be used as a neural network message probability compute circuitry to estimate message probability compute data based on input data encoded by the ECC encoder 310, using any of multiple encoding techniques available to the ECC encoder. The NN MPC 314, which may also be a RNN MPC, may estimate message probability compute data, to facilitate providing decoded data from the ECC decoder 312. In the example, the output from the NN MPC 314 is message probability compute data that is representative of the encoded data as if the encoded data was iteratively decoded, e.g., by an MPC decoder with a feedback error path.

The ECC encoder 310 and the ECC decoder 312 may each be implemented using discrete components such as an application specific integrated circuit (ASIC) or other circuitry, or the components may reflect functionality provided by circuitry within the controller 308 that does not necessarily have a discrete physical form separate from other portions of the controller 308. Although illustrated as components within the controller 308 in FIG. 3, each of the ECC encoder 310 and ECC decoder 312 may be external to the controller 308 or have a number of components located within the controller 308 and a number of components located external to the controller 308.

The memory device 316 may include a number of arrays of memory cells (e.g., non-volatile memory cells). The arrays can be flash arrays with a NAND architecture, for example. However, embodiments are not limited to a particular type of memory array or array architecture. Floating-gate type flash memory cells in a NAND architecture may be used, but embodiments are not so limited. The cells may be multi-level cells (MLC) such as triple level cells (TLC) which store three data bits per cell. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

According to a number of embodiments, controller 308 may control encoding of a number of received data bits according to the ECC encoder 310 that allows for later identification of erroneous bits and the conversion of those erroneous bits to erasures. The controller 308 may also control programming the encoded number of received data bits to a group of memory cells in memory device 316.

The apparatus shown in FIG. 3 may be implemented in any of a variety of products employing processors and memory including for example cameras, phones, wireless devices, displays, chip sets, set top boxes, gaming systems, vehicles, and appliances. Resulting devices employing the memory system may benefit from examples of neural networks described herein to perform their ultimate user function.

From the foregoing it will be appreciated that, although specific embodiments have been described herein for purposes of illustration, various modifications may be made while remaining with the scope of the claimed technology. Certain details are set forth herein to provide an understanding of described embodiments of technology. However, other examples may be practiced without various of these particular details. In some instances, well-known circuits, control signals, timing protocols, neural network structures, algorithms, and/or software operations have not been shown in detail in order to avoid unnecessarily obscuring the described embodiments. Other embodiments may be utilized, and other changes may be made, without departing from the spirit or scope of the subject matter presented here.

Figure 4:
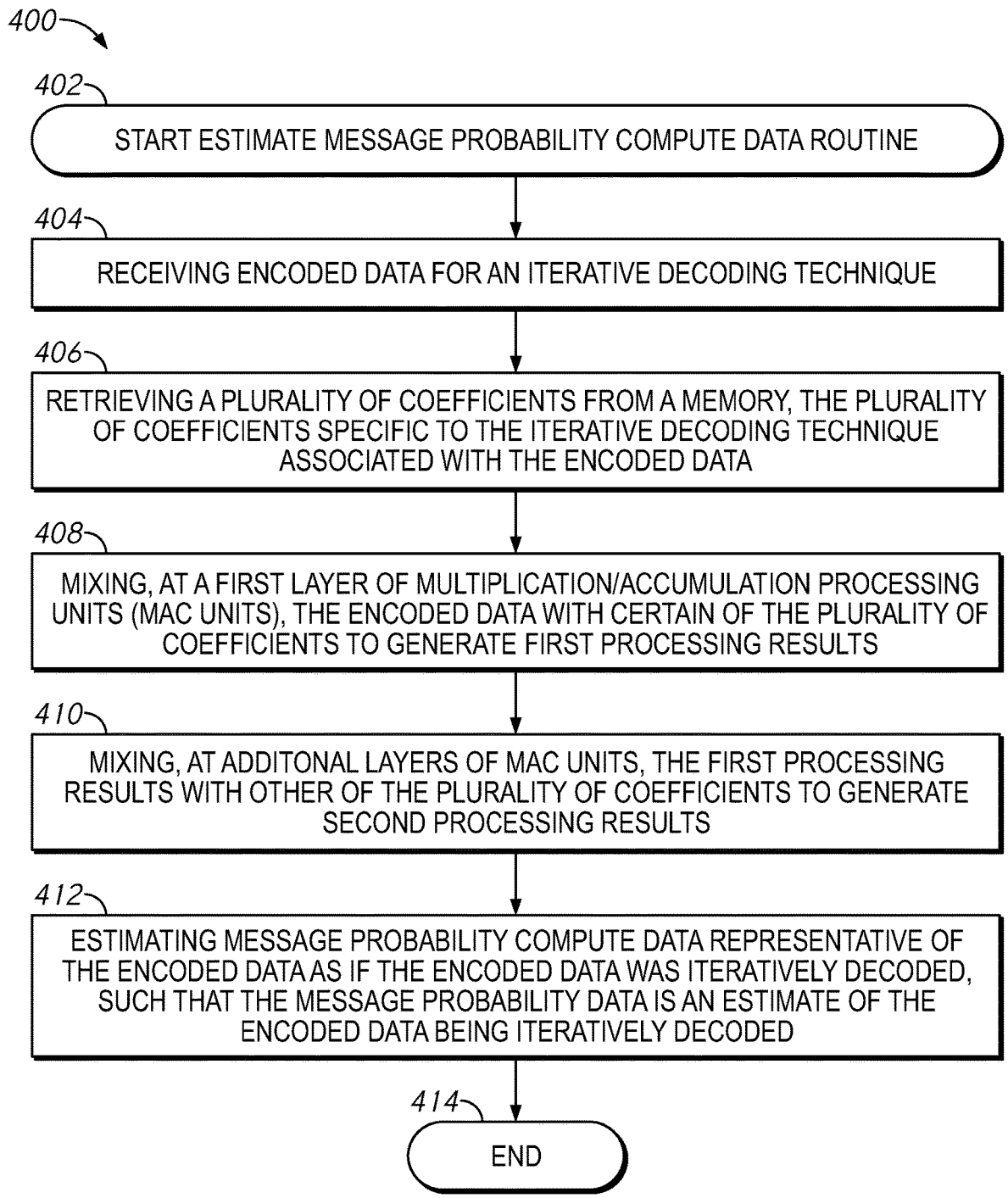
FIGS. 4 and 5 are flowcharts of methods arranged in accordance with examples described herein.

FIG. 4 is a flowchart of a method 400 in accordance with examples described herein. Example method 400 may be implemented using, for example, system 100 in FIG. 1D, the neural network 150 of FIG. 1E, neural network 170 of FIG. 1F (e.g., being implemented by one or more processing units of FIGS. 2A-2C), and/or the NN MPC 314 in ECC decoder 312 of FIG. 3, or any system or combination of the systems depicted in the aforementioned Figures. In some examples, the blocks in example method 400 may be performed by a computing device such as an electronic device 110 of FIG. 1D and/or in conjunction with a processing unit, such as processing circuitry 112 of FIG. 2A, 2B, or 2C. The operations described in blocks 402-412 may also be stored as computer-executable instructions in a computer-readable media 105, storing the executable instructions 115 for a neural network to estimate message probability compute data based on encoded data.

Example method 400 may begin with a block 402 that starts execution of the mixing encoded input data with coefficients data routine. The method may include a block 404 that recites "receiving encoded data for an iterative decoding technique." In the context of apparatus 300, the encoded data may be obtained from the memory device 316, as described with respect to FIG. 3. As described herein, the processing unit may be configured to obtain a variety of types of input data that may be encoded with various encoding techniques, such as data that has been encoded with a low density parity check coding (LDPC), a Reed-Solomon coding, a Bose-Chaudhuri-Hocquenghem (BCH), and/or Polar coding. The various encoding techniques may utilize iterative decoding to decode the encoded data, for example, using a MPC decoder 30. Accordingly, an MPC decoder 50 may be implemented for decoding the encoded data, as if the encoded data was iteratively decoded. Accordingly, a neural network MPC may be implemented to facilitate decoding of the encoded data.

Block 404 may be followed by block 406 that recites "retrieving a plurality of coefficients from a memory, the plurality of coefficients specific to the iterative decoding technique associated with the encoded data." As described herein, the processing unit may retrieve coefficients for mixing with encoded input data; for example, utilizing a memory look-up unit (MLU). For example, the memory may store (e.g., in a database) associations between pluralities of coefficients and various encoding techniques described herein that may utilize iterative decoding. For example, the processing unit may select the coefficients from a memory part of the implementing computing device, from a memory part of an external computing device, or from a memory implemented in a cloud-computing device. In turn, the plurality of coefficients may be retrieved from the memory as requested by the processing unit.

Block 406 may be followed by block 408 that recites "mixing, at a first layer of multiplication/accumulation processing units (MAC units), the encoded data with certain of the plurality of coefficients to generate first processing results." As described herein, the processing unit utilizes certain of the plurality of coefficients such that mixing such coefficients with encoded input data generates output data that reflects the processing of the input data with coefficients by the circuitry of FIG. 2A, 2B, or 2C. In some implementations of a recurrent neural network (e.g., recurrent neural network 170), delayed versions of respective outputs of the first layer of MAC units and the encoded input data are mixed to generate the output data, e.g., an estimate of message probability compute data. For example, various ALUs in an integrated circuit may be configured to operate as the circuitry of FIG. 2A, 2B, or 2C, thereby mixing the input data and delayed versions of respective outputs of the first layer of MAC units with the coefficients as described herein. For example, with reference to FIG. 2A, the input data and delayed versions of respective outputs of the first layer of MAC units may be calculated with the plurality of coefficients to generate first processing results, at a first layer of multiplication/accumulation processing units (MAC units). In some examples, various hardware platforms may implement the circuitry of FIG. 2A, 2B, or 2C, such as an ASIC, a DSP implemented as part of a FPGA, or a system-on-chip.

Block 408 may be followed by block 410 that recites "mixing, at additional layers of MAC units, the first processing results with other of the plurality of coefficients to generate second processing results." As described herein, the processing unit utilizes additional plurality of coefficients such that mixing the other coefficients with certain processing results generates output data that reflects the processing of the input data with coefficients by the circuitry of FIG. 2A, 2B, or 2C. In some implementations of a recurrent neural network (e.g., recurrent neural network 170), the first processing results and delayed versions of at least a portion of the first processing results are mixed to generate the output data (e.g., an estimate of decoded data). For example, with reference to FIG. 2A, the processing results of the first layer (e.g., multiplication processing results) and delayed versions of at least a portion of those processing results may be calculated with the additional plurality of coefficients to generate second processing results, at a second layer of multiplication/accumulation processing units (MAC units). The processing results of the second layer may be calculated with an additional plurality of coefficients to generate the output data B(1) 230.

Block 410 may be followed by block 412 that recites "estimating message probability compute data representative of the encoded data as if the encoded data was iteratively decoded, such that the message probability compute data is an estimate of the encoded data being iteratively decoded." As described herein, the neural network 150 or recurrent neural network 170 provides output data as output bits which represent the processed data, corresponding to the encoded input data (e.g., N encoded input bits) having processed by message probability compute data iteratively in an iterative decoder. Thus, the estimated message probability compute data is representative of the encoded data as being equivalent to the output of a message probability compute circuitry in an iterative decoder after a certain number of k iterations. Accordingly, neural networks described herein transform encoded input data to an estimate of the message probability compute data as if the encoded data was being iteratively decoded. Block 412 may be followed by block 414 that ends the example method 400. In some examples, block 410 may be an optional block.

Figure 5:
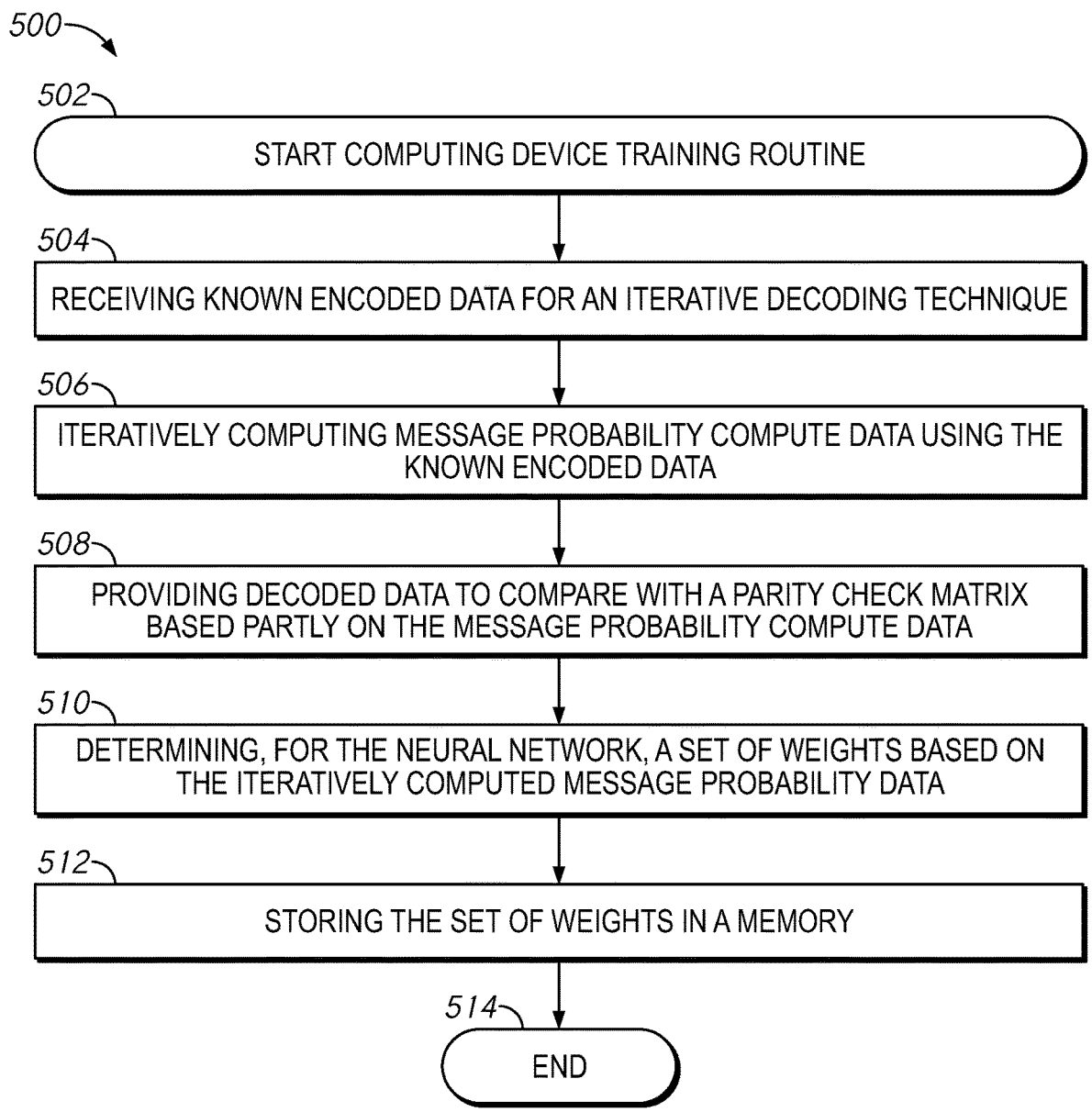

FIG. 5 is a flowchart of a method 500 arranged in accordance with examples described herein. Example method 500 may be implemented using, for example, system 100 in FIG. 1D, the neural network 150 of FIG. 1E, neural network 170 of FIG. 1F (e.g., being implemented by one or more processing units of FIGS. 2A-2C), and/or the NN MPC 314 in ECC decoder 312 of FIG. 3, or any system or combination of the systems depicted in the aforementioned Figures. For example, a NN MPC 52 or a NN MPC 314 may be trained using the method 500. In some examples, the blocks in example method 500 may be performed by a computing device such as an electronic device 110 of FIG. 1D and/or in conjunction with a processing unit, such as processing circuitry 112 of FIG. 2A, 2B, or 2C. The operations described in blocks 502-512 may also be stored as computer-executable instructions in a computer-readable media 105, storing executable instructions to train a neural network to estimate message probability compute data based on encoded data. Additional, fewer, and/or different blocks may be used in other examples, and the order of the blocks may be different in other examples.

Example method 500 may begin with a block 502 that starts execution of the computing device training routine. The method may include a block 504 recites "receiving known encoded data for an iterative decoding technique." Known encoded and known decoded data may be received by a computing device (e.g., electronic device 110) that includes a neural network, such as the neural network 150 of FIG. 1E, neural network 170 of FIG. 1F (e.g., as implemented by one or more processing units of FIGS. 2A-2C), and/or the ECC decoder 312 of FIG. 3. Signaling indicative of the known data (e.g., a set of data pairs) may be provided to the computing device. In the example, the known encoded data is encoded in accordance with an encoding technique, e.g., by ECC encoder 310. Continuing in the example, data (e.g., signaling indicative of data) encoded with the particular encoding technique may be retrieved from a memory (e.g., memory 316) of a computing device 300. Any of a variety of encoding techniques may have been used to encode the data. The known decoded data may include known message probability compute data.

Block 506 may follow block 504. Block 506 recites "iteratively computing message probability compute data using the known encoded data." In an example in the context of FIG. 1C, the NN MPC 52 may iteratively compute message probability compute data using the known encoded data until an output of the NN MPC 52 is representative of message probability compute data that is indicative of the known decoded data. For example, the target of the output 62 may be the known decoded data. Therefore, the NN MPC 52 may compute or train message probability compute data until an estimate output by the NN MPC 52 is indicative of the decoded data. To determine whether an output iteratively computed is an estimate of the message probability compute data, the NN MPC 52 may operate in the context of an MPC decoder 50, which includes a DMB circuitry 56. Accordingly, at a DMB circuitry 56, the generated message probability compute data for the known encoded data in accordance with the encoding technique is compared to a predetermined threshold to generate decoded data. Based on the comparison, the DMB circuitry 56 may provide an output as decoded data to compare with a parity check matrix based on the known decoded data. In various implementations during a training routine, block 506-510, described next, may be repeated iteratively until the output data provided by the DMB circuitry 56 as decoded data is determined to be the known decoded data.

Block 508 may follow block 506. Block 508 recites "providing decoded data to compare with a parity check matrix based partly on the message probability compute data." After processing message probability compute data by a DMB circuitry 56, the output is provided to a PMC circuitry 58, where the decoded data is compared with a parity check matrix to validate that the decoded data is indicative of the data encoded with the encoding technique as if the data encoded was iteratively decoded. Accordingly, the training method 500 may include the use of PMC circuitry 58 to compare the decoded data with a parity check matrix. Once validated, the decoded data may be provided by a MPC decoder 50 as decoded data to be compared with the known decoded data as part of the training routine.

Block 510 may follow block 508. Block 510 recites "determining, for the neural network, a set of weights based on the iteratively computed message probability compute data." For example, a neural network, such as a NN MPC 52 or a NN MPC 314, may be trained using the known encoded and known decoded data received in block 504. The validated decoded data from an MPC decoder 50 may be compared with the known decoded data received in block 504. Based on the comparison, the weights used to estimate the message probability compute data using the neural network may be evaluated as the set of weights. In some implementations, the known decoded data may include known message probability compute data which may be compared to the estimated message probability compute data from the DMB circuitry 56 of block 506. Accordingly, based on the comparison, the weights used to estimate the message probability compute data using the neural network may be evaluated as the set of weights.

The weights may be numerical values, which, when used by the neural network, allow the neural network to estimate the message probability compute data based on the encoded input data encoded with an encoding technique. The weights may be stored, for example, in the weights memory 118 of FIG. 1D or memory 145 of FIG. 2A, 2B, or 2C. In some examples, training may not be performed, and an initial set of weights may simply be provided to a neural network, e.g., based on training of another neural network.

In some examples, multiple sets of data pairs may be received (e.g., in block 504), with each set corresponding to data encoded with a different encoding technique. Accordingly, multiple sets of weights may be determined (e.g., in block 504), each set corresponding to a different encoding technique. For example, one set of weights may be determined which may be used to decode data encoded in accordance with LDPC coding while another set of weights may be determined which may be used to decode data encoded with BCH coding.

Block 512 may follow block 510. Block 512 recites "storing the set of weights in a memory." In some examples, a set of weights may be selected that is associated with the particular encoding technique used to encode the data received in block 510. The set of weights may be stored in a memory (e.g., memory 118 of FIG. 1D) for selection from among multiple available sets of weights, each for use in estimating message probability compute data based on data encoded with a different encoding technique.

In some examples, blocks 504-512 may be repeated for data encoded with different encoding techniques. For example, data may be received in block 504, encoded with one particular encoding technique (e.g., LDPC coding). A set of weights may be selected that is for use with LDPC coding and provided to a neural network for determining weights in block 510. Data may then be received in block 504, encoded with a different encoding technique (e.g., BCH coding). Another set of weights may be selected that is for use with BCH coding and provided to a neural network for determining weights in block 510. In this manner, one neural network may be trained to estimate message probability compute data based on data encoded with multiple encoding techniques.

The blocks included in the described example methods 400 and 500 are for illustration purposes. In some embodiments, the blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc.

Examples described herein may refer to various components as "coupled" or signals as being "provided to" or "received from" certain components. It is to be understood that in some examples the components are directly coupled one to another, while in other examples the components are coupled with intervening components disposed between them. Similarly, signal may be provided directly to and/or received directly from the recited components without intervening components, but also may be provided to and/or received from the certain components through intervening components.

Certain details are set forth above to provide a sufficient understanding of described examples. However, it will be clear to one skilled in the art that examples may be practiced without various of these particular details. The description herein, in connection with the appended drawings, describes example configurations and does not represent all the examples that may be implemented or that are within the scope of the claims. The terms "exemplary" and "example" as may be used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), or optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above are also included within the scope of computer-readable media.

Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing it will be appreciated that, although specific examples have been described herein for purposes of illustration, various modifications may be made while remaining with the scope of the claimed technology. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus comprising:
a neural network configured to receive encoded data using an encoding technique associated with iterative decoding, wherein the neural network is further configured to estimate message probability compute data based on the encoded data, wherein the neural network comprises:
a first stage configured to receive the encoded data, to combine the encoded data with a first set of predetermined weights, and to evaluate at least one non-linear function using combinations of the encoded data and delayed versions of the combinations of the encoded data to provide intermediate data; and
at least a second stage configured to receive the intermediate data and combine the intermediate data using a second set of predetermined weights to generate the message probability compute data, wherein the first and second sets of predetermined weights were trained in accordance with the iterative decoding technique; and
first circuitry coupled to the neural network and configured to receive the message probability compute data, wherein the first circuitry is further configured to compare the message probability compute data with a predetermined threshold associated with the iterative decoding to generate decoded data; and
second circuitry configured to compare the decoded data with a parity matrix.

2. The apparatus of claim 1, wherein the message probability compute data is equivalent to the output after processing of multiple iterations by a feedback error path associated with message probability compute circuitry an iterative decoder.

3. The apparatus of claim 1, wherein the message probability compute data is representative of the encoded data as if the encoded data was iteratively decoded.

4. The apparatus of claim 1, wherein the first and second sets of predetermined weights are based on training of a neural network on encoded data and delayed versions of combinations of the encoded data, the neural network trained to generate certain message probability compute data of the encoded data.

5. The apparatus of claim 1, further comprising a computer readable media encoded with executable instructions to select the first and second sets of predetermined weights for the neural network based on the encoding technique associated with the iterative decoding.

6. The apparatus of claim 1, wherein the first stage of circuitry comprises a first plurality of multiplication/accumulation units, the first plurality of multiplication/accumulation units each configured to multiply at least one hit of the encoded data with at least one of the first set of predetermined weights and sum multiple weighted bits of the encoded data.

7. The apparatus of claim 6, wherein the first stage of circuitry further comprises a first plurality of memory look-up units (MLUs), the first plurality of MLUs each configured to retrieve at least one intermediate data value corresponding to an output of a respective one of the first plurality of multiplication/accumulation units based on the at least one non-linear function.

8. The apparatus of claim 6, wherein the first stage of circuitry further comprises a plurality of delay units configured to provide the delayed versions of the combinations of the encoded data based on the at least one intermediate data value provided by the first plurality of MLUs.

9. A method comprising:
receiving, at a computing device that comprises a neural network, encoded data and decoded data, wherein the encoded data is encoded in accordance with an encoding technique;
computing message probability compute data using the encoded data until an output of the neural network is representative of message probability compute data that is indicative of the decoded data;
comparing the message probability compute data for the encoded data in accordance with the encoding technique to a predetermined threshold to generate the decoded data;
based on the comparison, providing the decoded data to compare with a parity check matrix based on the decoded data; and
determining, for the neural network, a set of weights based on the computed message probability compute data. wherein determining the set of weights comprises selecting weights resulting in a minimized value of an error function between the output of the neural network and the decoded data.

10. The method of claim 9, further comprising:
receiving, from a memory of the computing device, data encoded in accordance with the encoding technique; and
estimating message probability compute data for the data encoded in accordance with the encoding technique using the neural network and the set of weights.

11. The method of claim 9, further comprising:
comparing the decoded data with the parity check matrix to validate that the decoded data is indicative of encoded data that is encoded in accordance with the encoding technique, as if the data encoded was iteratively decoded; and writing the decoded data to or reading the decoded data from a memory or storage medium of the computing device.

12. The method of claim 9, wherein the encoding technique comprises Reed-Solomon coding, Bose-Chandhuri-Hocquenghem (BCH) coding, low-density parity check (LDPC) coding, Polar coding, or combinations thereof.

13. The method of claim 9, wherein determining the set of weights comprises using a k-means cluster technique to determine center vectors for the neural network.

14. A method comprising:
  mixing encoded data for an iterative decoding technique received at a processing unit with a plurality of coefficients, the plurality of coefficients specific to the iterative decoding technique associated with the encoded data, wherein mixing the encoded data comprises:
    mixing, at a first layer of multiplication/accumulation processing units (MAC units) of a plurality of MAC units, the encoded data and delayed versions of respective outputs of the first layer of MAC units with certain of the plurality of coefficients to generate first processing results;
    mixing, at additional layers of MAC units of the plurality of MAC units, the first processing results and delayed versions of at least a portion of the first processing results with others of the plurality of coefficients to generate second processing results; and
  estimating message probability data based partly on the second processing results, the message probability data representative of the encoded data as if the encoded data was iteratively decoded, such that the message probability data is an estimate of the encoded data being iteratively decoded.

15. The method of claim 14, wherein mixing the encoded data received at the processing unit using the plurality of coefficients further comprises:

delaying, at respective delay units associated with the first layer of MAC units, the respective outputs of the first layer of MAC units to generate the delayed versions of the respective outputs of the first layer of MAC units.

16. The method of claim 14, wherein mixing, at the first layer of MAC units of the plurality of MAC units, the encoded data and the delayed versions of the respective outputs of the first layer of MAC units with the certain of the plurality of coefficients comprises:
  multiplying the encoded data and the delayed versions of the respective outputs of the first layer of MAC units with respective coefficients of the certain of the plurality of coefficients to generate the first, processing results.

17. The method of claim 14, further comprising:
  obtaining, at the processing unit, encoded data from a memory coupled to the processing unit, including an indication from a touchscreen of a mobile communication device that a certain encoding technique for the encoded data was utilized.

18. The method of claim 14, wherein the certain encoding technique comprises Reed-Solomon coding, Bose-Chaudhuri-Hocquenghem (BCH) coding, low-density parity check (LDPC) coding, Polar coding, or combinations thereof.

19. The method of claim 14, wherein mixing, at the first layer of the plurality of MAC units, the encoded data and delayed versions of respective outputs of the first layer of MAC units with the certain of the plurality of coefficients to generate the first processing results comprises:
  retrieving, from a first layer of memory look-up units (MLUs) of a plurality of MLUs, the certain of the plurality of coefficients for mixing with the encoded data and delayed versions of respective outputs of the first a of MAC units; and
  providing, by the first layer of the MLUs, the first processing results to at least one of the additional layers of MAC units of the plurality of MAC units.

* * * * *

UNITED STATES PATENT AND TRADEMARK OFFICE
CERTIFICATE OF CORRECTION

PATENT NO. : 11,973,513 B2  
APPLICATION NO. : 17/302226  
DATED : April 30, 2024  
INVENTOR(S) : Fa-Long Luo and Jaime Cummins It is certified that error appears in the above-identified patent and that said Letters Patent is hereby corrected as shown below:

In the Claims

| Column | Line | Claim | Reads | Should Read |
|---|---|---|---|---|
| 35 | 66 | 2 | with message probability compute circuitry an iterative decoder. | with message probability compute circuitry in an iterative decoder. |
| 36 | 18 | 6 | configured to multiply at least one hit at the encoded data | configured to multiply at least one bit of the encoded data |
| 37 | 8 | 12 | Bose-Chandhuri-Hocquenghern (BCH) coding | Bose-Chaudhuri-Hocquenghern (BCH) coding |
| 38 | 35 | 19 | the first a of MAC units; | the first layer of MAC units; |

Signed and Sealed this  
Ninth Day of July, 2024

Katherine Kelly Vidal  
*Director of the United States Patent and Trademark Office*